United States Patent
Kondo et al.

(10) Patent No.: US 9,583,238 B2
(45) Date of Patent: Feb. 28, 2017

(54) CHIP COMPONENT AND PRODUCTION METHOD THEREFOR

(71) Applicant: ROHM CO., LTD., Kyoto (JP)

(72) Inventors: Yasuhiro Kondo, Kyoto (JP); Katsuya Matsuura, Kyoto (JP)

(73) Assignee: ROHM CO., LTD., Kyoto (JP)

(*) Notice: Subject to any disclaimer, the term of this patent is extended or adjusted under 35 U.S.C. 154(b) by 0 days.

(21) Appl. No.: 14/431,771

(22) PCT Filed: Aug. 7, 2013

(86) PCT No.: PCT/JP2013/071412
§ 371 (c)(1),
(2) Date: Mar. 26, 2015

(87) PCT Pub. No.: WO2014/050322
PCT Pub. Date: Apr. 3, 2014

(65) Prior Publication Data
US 2015/0243412 A1    Aug. 27, 2015

(30) Foreign Application Priority Data

Sep. 27, 2012  (JP) ................. 2012-215062

(51) Int. Cl.
| | | |
|---|---|---|
| H01C 10/00 | (2006.01) | |
| H01C 1/012 | (2006.01) | |
| H01C 1/14 | (2006.01) | |
| H01G 2/06 | (2006.01) | |
| H01G 4/228 | (2006.01) | |

(Continued)

(52) U.S. Cl.
CPC ............. *H01C 1/012* (2013.01); *H01C 1/14* (2013.01); *H01G 2/065* (2013.01); *H01G 4/228* (2013.01); *H01G 5/01* (2013.01); *H01C 7/003* (2013.01); *H01C 17/06* (2013.01); *H01G 4/008* (2013.01); *H01G 4/30* (2013.01)

(58) Field of Classification Search
CPC .......... H01C 1/012; H01C 1/14; H01C 7/003; H01C 17/06
USPC ..................................... 338/200, 226, 215
See application file for complete search history.

(56) References Cited

U.S. PATENT DOCUMENTS 3,778,886 A * 12/1973 Shields ............... H01L 23/5256
148/DIG. 20
4,298,856 A * 11/1981 Schuchardt ............ H01C 17/23
29/620

(Continued)

FOREIGN PATENT DOCUMENTS

| CN | 1655353 A | 8/2005 |
|---|---|---|
| CN | 102165585 A | 8/2011 |

(Continued)

*Primary Examiner* — Kyung Lee
(74) *Attorney, Agent, or Firm* — Rabin & Berdo, P.C.

(57) ABSTRACT

A chip part according to the present invention includes a substrate having a front surface and a side surface, an electrode integrally formed on the front surface and the side surface so as to cover an edge portion of the front surface of the substrate, and an insulating film interposed between the electrode and the substrate. A circuit assembly according to the present invention includes the chip part according to the present invention and a mounting substrate having a land, bonded by solder to the electrode, on a mounting surface facing the front surface of the substrate.

21 Claims, 25 Drawing Sheets

(51) Int. Cl.
*H01G 5/01* (2006.01)
*H01G 4/30* (2006.01)
*H01C 7/00* (2006.01)
*H01C 17/06* (2006.01)
*H01G 4/008* (2006.01)

(56) References Cited

U.S. PATENT DOCUMENTS

| | | | | |
|---|---|---|---|---|
| 4,862,136 A * | 8/1989 | Birkner | ............... | H01C 10/16 338/195 |
| 6,060,760 A * | 5/2000 | Tan | ............... | H01L 27/0802 257/536 |
| 6,529,116 B2 * | 3/2003 | Van Den Broek | ... | H01C 17/242 338/195 |
| 7,592,855 B2 * | 9/2009 | Kamatani | ............... | H01L 27/0629 327/334 |
| 7,764,109 B2 * | 7/2010 | Goto | ............... | G01R 15/04 327/530 |
| 7,825,768 B2 * | 11/2010 | Onishi | ............... | H01L 23/5256 257/529 |
| 2005/0179127 A1 | 8/2005 | Takyu et al. | | |
| 2005/0212650 A1 * | 9/2005 | Shovlin | ............... | B23K 26/0732 338/195 |
| 2011/0163435 A1 | 7/2011 | Tsukamoto et al. | | |

FOREIGN PATENT DOCUMENTS

| | | |
|---|---|---|
| JP | H05-13201 A | 1/1993 |
| JP | H09-323300 A | 12/1997 |
| JP | 2001-076912 A | 3/2001 |
| JP | 2002-231120 A | 8/2002 |
| JP | 2006-024767 A | 1/2006 |
| JP | 2012-102169 A | 5/2012 |

* cited by examiner

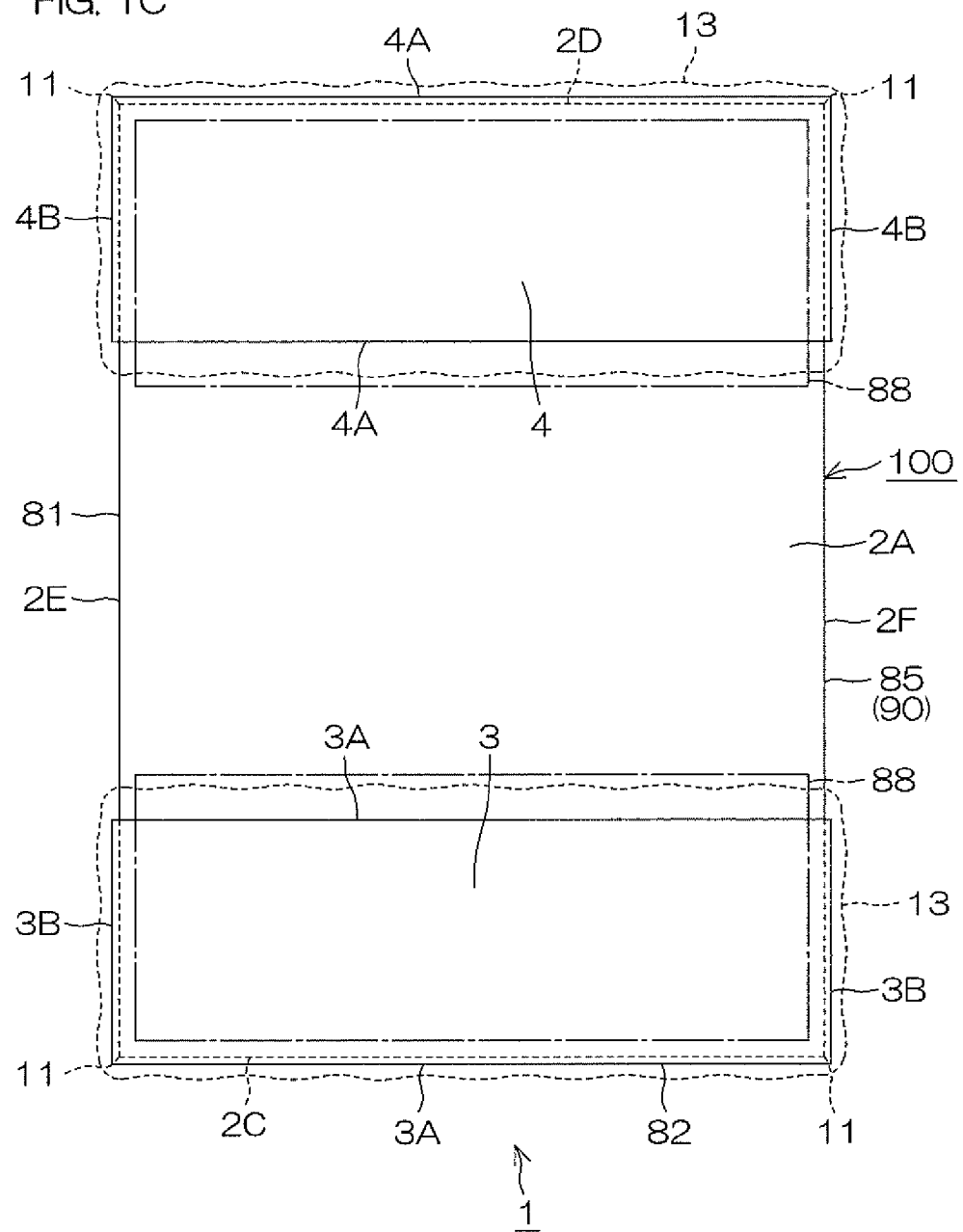

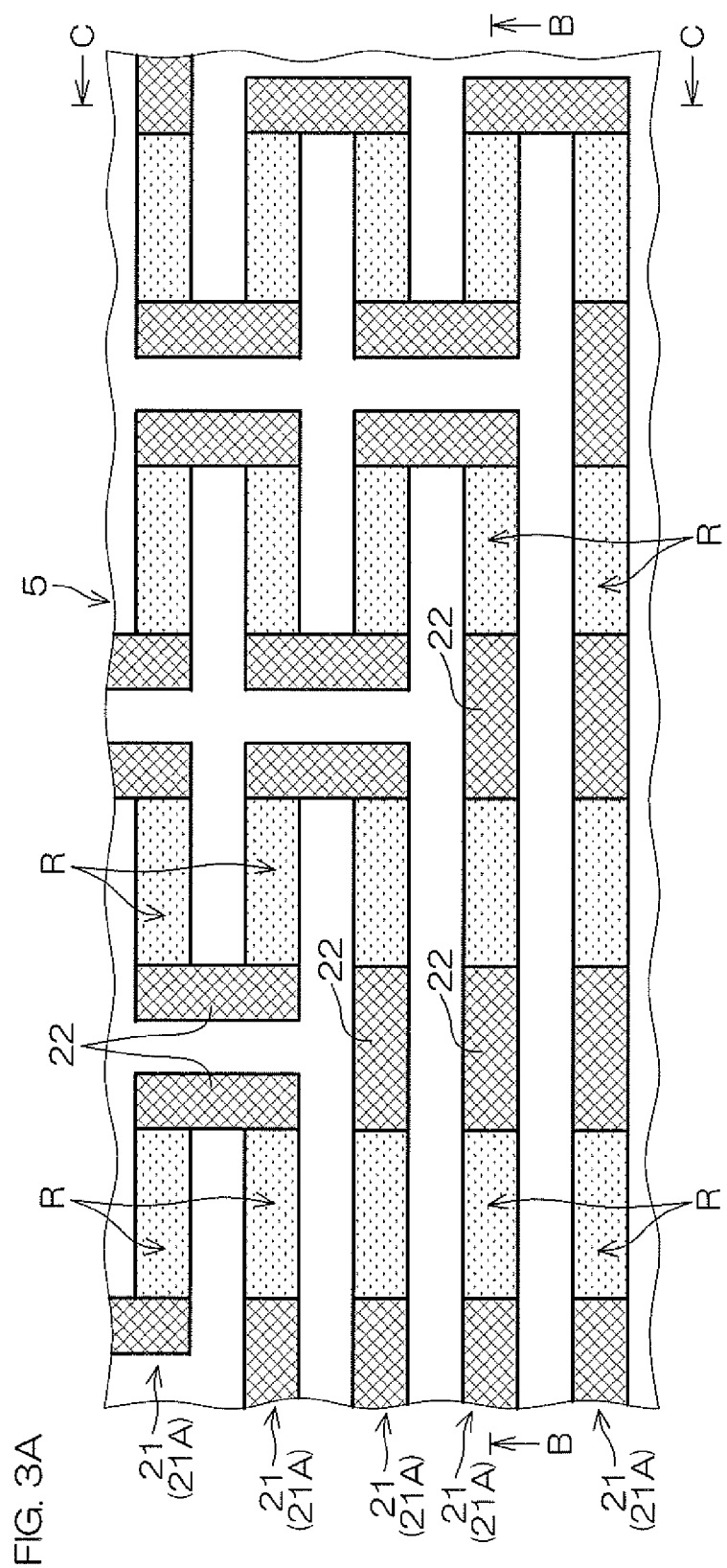

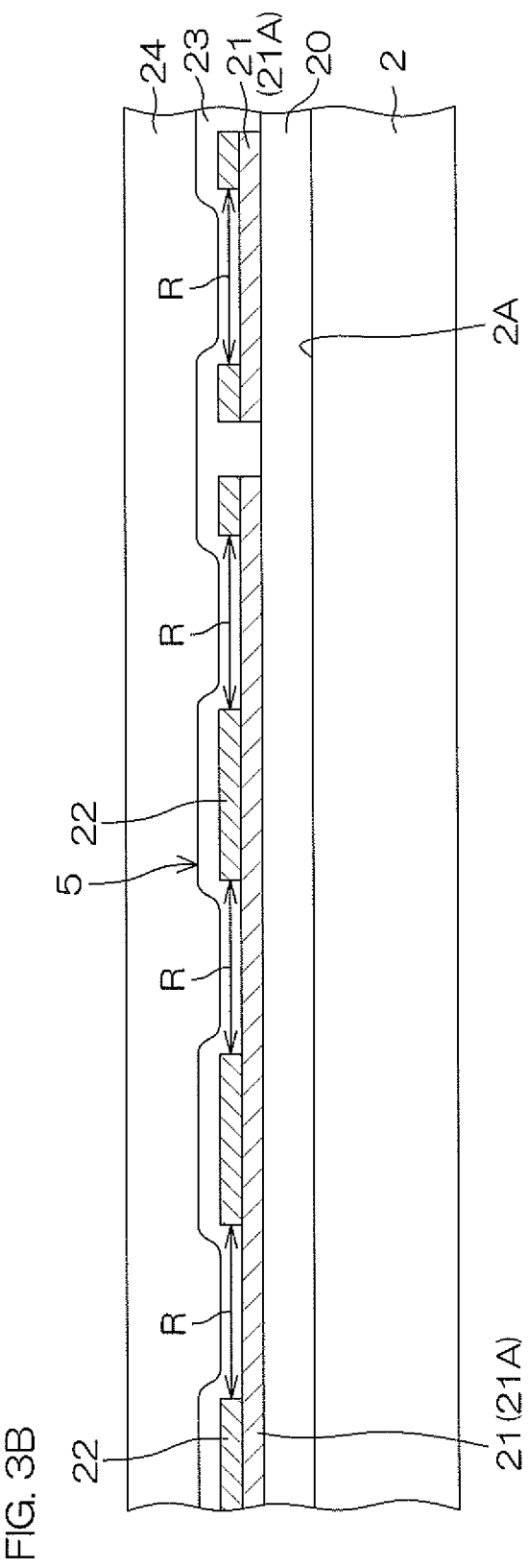

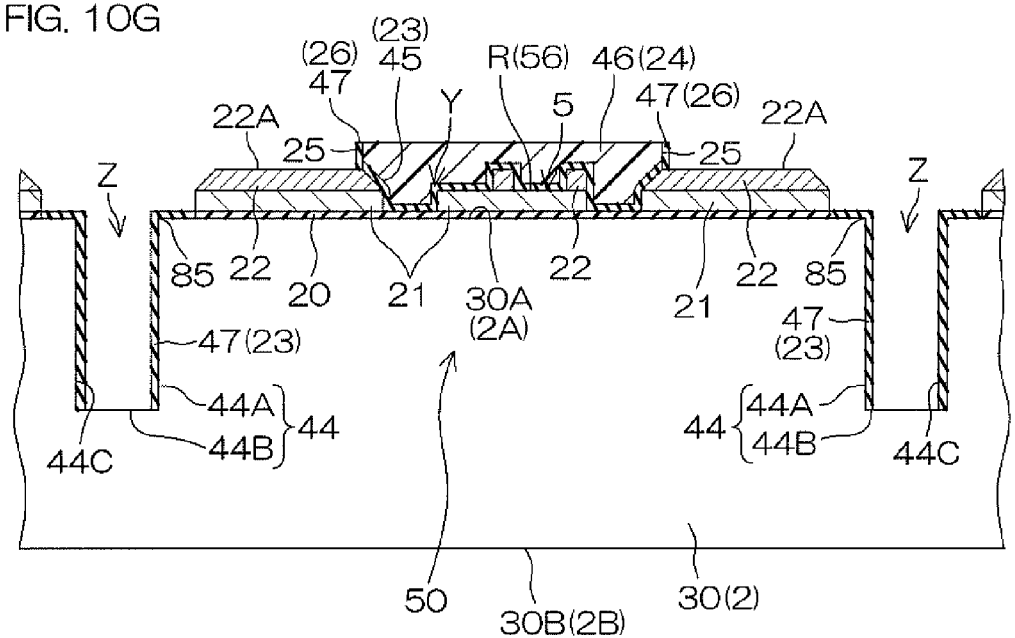
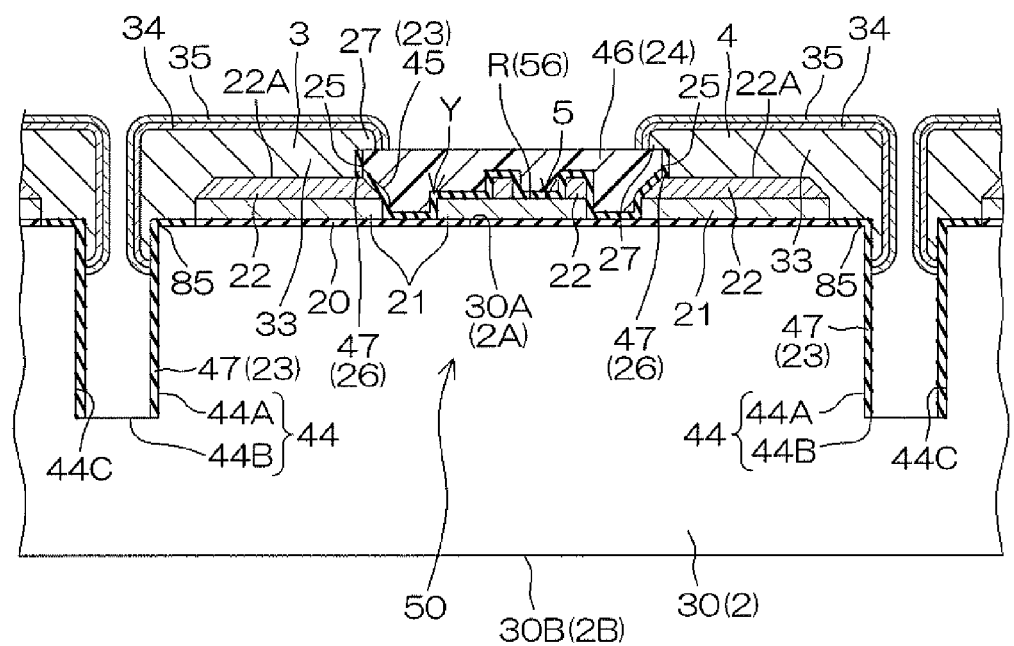

| S1 | Removal of organic matter |
| S2 | Removal of oxide film |
| S3 | Zincate treatment |
| S4 | Peeling off of front surface |
| S5 | Ni plating |
| S6 | Pd plating |
| S7 | Au plating |
| S8 | Drying |

CHIP COMPONENT AND PRODUCTION METHOD THEREFOR

FIELD OF THE ART

The present invention relates to a chip part, a production method therefor, and a circuit assembly and an electronic device that include the chip part.

BACKGROUND ART

Patent Document 1 discloses a chip resistor with which a resistive film formed on an insulating substrate is laser-trimmed and a cover coat is thereafter formed from glass.

PRIOR ART DOCUMENT

Patent Document

Patent Document 1: Japanese Patent Application Publication No. 2001-76912

SUMMARY OF THE INVENTION

Problem to be Solved by the Invention

With the chip resistor according to Patent Document 1, an electrode is formed only on a surface at one side of the insulting substrate. Therefore when the chip resistor is soldered onto a mounting substrate, the chip resistor is adhered to the mounting substrate only at the surface at one side and the adhesion strength may thus be insufficient. Moreover, the adhesion surface is only a single surface and therefore the chip resistor is not stable on the solder and there is also a problem that the chip resistor detaches easily when a force in a lateral direction along the adhesion surface (direction along the mounting substrate) is applied to the chip resistor.

An object of the present invention is to provide a chip part that enables the strength of adhesion to a mounting substrate to be improved and further enables stabilization of the mounting form.

Another object of the present invention is to provide a production method for chip part that enables easy production of the chip part that enables the strength of adhesion to the mounting substrate to be improved and further enables stabilization of the mounting form.

Yet another object of the present invention is to provide a circuit assembly that includes the chip part according to the present invention and an electronic device that includes such a circuit assembly.

Means for Solving the Problem

A chip part according to the present invention includes a substrate having a front surface and a side surface, an electrode integrally formed on the front surface and the side surface so as to cover an edge portion of the front surface of the substrate, and an insulating film interposed between the electrode and the substrate.

With this arrangement, the electrode is formed on the side surface in addition to the front surface of the substrate and therefore the adhesion area for soldering the chip part onto the mounting substrate can be enlarged. Consequently, the amount of solder adsorbed to the electrode can be increased to improve the adhesion strength. Also, the solder is adsorbed so as to extend from the front surface to the side surface of the substrate and the chip part can thus be held from the two directions of the front surface and the side surface in the mounted state. The mounting form of the chip part can thus be stabilized.

Moreover, not only is the electrode simply formed on the side surface of the substrate but the insulating film is also interposed between the electrode and the substrate. For example, a requirement to avoid short-circuiting of the substrate and the electrode can thereby be answered.

Also preferably with the chip part, the substrate has a rectangular shape in a plan view and the electrode is formed so as to cover the edge portion of three sides of the substrate. With this arrangement, in the mounted state, the chip part can be held from the three directions of the side surfaces of the substrate to further stabilize the mounting form of the chip part.

Also the chip part preferably further includes a wiring film that is formed on the front surface of the substrate across an interval from the edge portion and is electrically connected to the electrode. With this arrangement, the wiring film is made independent of the electrode for external connection to enable a wiring design to be made in accordance with an element pattern formed on the front surface of the substrate.

Preferably with the wiring film, a peripheral edge portion facing the edge portion of the substrate covered by the electrode is selectively exposed and a peripheral edge portion other than the exposed portion is selectively covered by a resin film. By this arrangement, a junction area of the electrode and the wiring film can be increased to decrease contact resistance.

Also, the electrode may be formed so as to project from a front surface of the resin film. In this case, a lead-out portion that is led out in a lateral direction along the front surface of the resin film to selectively cover the front surface may be included.

Also preferably, the electrode includes an Ni layer and an Au layer and the Au layer is exposed at a frontmost surface. With the electrode of this arrangement, the front surface of the Ni layer is covered by the Au layer to enable prevention of oxidation of the Ni layer.

Also preferably, the electrode further includes a Pd layer interposed between the Ni layer and the Au layer. With the electrode of this arrangement, even if a penetrating hole (pinhole) forms in the Au layer of the electrode due to thinning of the Au layer, the Pd layer interposed between the Ni layer and the Au layer closes the penetrating hole and the Ni layer can thus be prevented from being exposed to the exterior through the penetrating hole and becoming oxidized.

In a case where two of the electrodes are provided across an interval, the chip part may be a chip resistor that includes a resistor body formed on the substrate and connected between the two electrodes. Preferably in this case, the chip part further includes a plurality of the resistor bodies and a plurality of fuses provided on the substrate and disconnectably connecting each of the plurality of the resistor bodies to the electrodes. With this chip part (chip resistor), a plurality of types of resistance values can be accommodated easily and rapidly by selectively cutting one or a plurality of the fuses. In other words, chip resistors of various resistance values can be realized with a common design by combining a plurality of resistor bodies that differ in resistance value.

Also in the case where two of the electrodes are provided across an interval, the chip part may be a chip capacitor that includes a capacitor element formed on the substrate and connected between the two electrodes. Preferably in this case, the chip part further includes a plurality of capacitor components that constitute the capacitor element and a plurality of fuses provided on the substrate and disconnectably connecting each of the plurality of the capacitor components to the electrodes. With this chip part (chip capacitor) a plurality of types of capacitance values can be accommodated easily and rapidly by selectively cutting one or a plurality of the fuses. In other words, chip capacitors of various capacitance values can be realized with a common design by combining a plurality of capacitor components that differ in capacitance value.

A circuit assembly according to the present invention includes the chip part according to the present invention and a mounting substrate having a land, bonded by solder to the electrode, on a mounting surface facing the front surface of the substrate. By this arrangement, a circuit assembly can be provided that includes the chip part that enables the strength of adhesion to the mounting substrate to be improved and further enables stabilization of the mounting form.

Preferably with the circuit assembly, the solder is formed to cover a front surface portion and a side surface portion of the electrode when viewed from a direction of a normal to the mounting surface. With this arrangement, the amount of solder adsorbed to the electrode can be increased to improve the adhesion strength. Also, the solder is adsorbed so as to extend from the front surface to the side surface of the electrode and the chip part can thus be held from the two directions of the front surface and the side surface of the substrate. The mounting form of the chip part can thus be stabilized.

An electronic device according to the present invention includes the circuit assembly according to the present invention and a housing that houses the circuit assembly. By this arrangement, an electronic part can be provided that includes the chip part that enables the strength of adhesion to the mounting substrate to be improved and further enables stabilization of the mounting form.

A production method for chip part according to the present invention includes a step of forming a groove of predetermined depth from a front surface of a substrate in a boundary region of a plurality of chip part regions of the substrate to achieve separation into substrates according to each of the plurality of chip part regions, a step of forming an insulating film on side surfaces of the groove to form the insulating film on side surfaces of the respective substrates, a step of growing by plating an electrode material on the insulating film along the side surfaces of the groove from the front surfaces and via edge portions of the respective substrates to form electrodes integrally on the front surfaces and the side surfaces so as to cover the edge portions of the front surfaces of the respective substrates, and a step of grinding rear surfaces of the substrates until the groove is reached to split the substrates into the plurality of chip parts.

By this method, the chip part according to the present invention can be produced easily by growing the electrode material by plating.

Preferably, the step of forming the electrode includes a step of growing the electrode material by electroless plating. By this method, the electrode material can be grown satisfactorily even on the insulating film. Also, in comparison to electrolytic plating, the number of process steps can be reduced to improve productivity.

The production method for chip part may further include a step of forming a wiring film on the front surface of the substrate of each of the plurality of chip part regions, the step of separating into the substrates may include a step of forming the groove so that an interval is formed between the edge portion of each substrate and the wiring film, and the step of forming the electrode may include a step of growing the electrode material from each wiring film by plating. Preferably in this case, the production method for chip part further includes a step of forming a resin film that covers the wiring film before the groove is formed and a step of selectively removing the resin film so as to expose a peripheral edge portion that is to face a region in the wiring film in which the groove is to be formed. With this method, there is nothing that hinders the plating growth between the wiring film and the edge portion of each substrate and plating growth can thus be achieved rectilinearly from the wiring film to the edge portion. Consequently, the time taken to form the electrode can be reduced.

Also preferably with the production method for chip part, the groove is formed by etching. With this method, the groove can be formed in the boundary region of all of the chip part regions of the substrate at once to enable reduction of the time required to produce the chip part.

BRIEF DESCRIPTION OF THE DRAWINGS

FIG. 1C is a schematic plan view, as viewed from an element forming surface side, of the chip resistor in the state of being mounted on the mounting substrate.

FIG. 3A is a partially enlarged plan view of the element shown in FIG. 2.

FIG. 3B is a vertical sectional view in the length direction taken along B-B of FIG. 3A for describing the arrangement of resistor bodies in the element.

MODES FOR CARRYING OUT THE INVENTION

Preferred embodiments of the present invention shall now be described in detail with reference to the attached drawings.

Figure 1A:
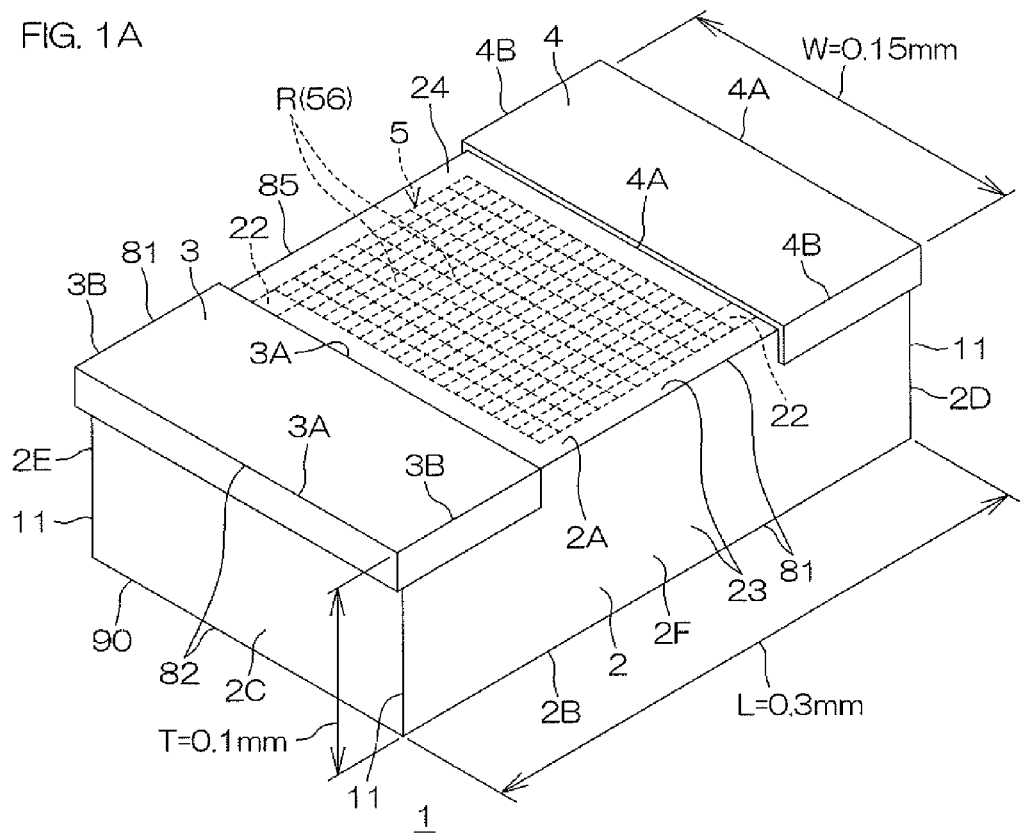
FIG. 1A is schematic perspective view for describing the arrangement of a chip resistor according to a preferred embodiment of the present invention.

FIG. 1A is a schematic perspective view for describing the arrangement of a chip resistor according to a preferred embodiment of the present invention.

The chip resistor 1 is a minute chip part and has a rectangular parallelepiped shape as shown in FIG. 1A. The planar shape of the chip resistor 1 is a rectangle with the two orthogonal sides (long side 81 and short side 82) being not more than 0.4 mm and not more than 0.2 mm, respectively. Preferably in regard to dimensions, the chip resistor 1 has a length L (length of the long side 81) of approximately 0.3 mm, a width W (length of the short side 82) of approximately 0.15 mm, and a thickness T of approximately 0.1 mm.

The chip resistor 1 is obtained by forming multiple chip resistors 1 in a lattice on a substrate, then forming a groove in the substrate, and thereafter performing rear surface polishing (or splitting of the substrate at the groove) to perform separation into the individual chip resistors 1.

The chip resistor 1 mainly includes a substrate 2 that constitutes the main body of the chip resistor 1, a first connection electrode 3 and a second connection electrode 4 that are to be external connection electrodes, and an element 5 connected to the exterior by the first connection electrode 3 and the second connection electrode 4.

The substrate 2 has a substantially rectangular parallelepiped chip shape. With the substrate 2, the surface constituting the upper surface in FIG. 1A is an element forming surface 2A. The element forming surface 2A is the surface of the substrate 2 on which the element 5 is formed and has a substantially oblong shape. The surface at the opposite side of the element forming surface 2A in the thickness direction of the substrate 2 is a rear surface 2B. The element forming surface 2A and the rear surface 2B are substantially the same in dimensions and same in shape and are parallel to each other. A rectangular edge defined by the pair of long sides 81 and short sides 82 at the element forming surface 2A shall be referred to as a peripheral edge portion 85 and a rectangular edge defined by the pair of long sides 81 and short sides 82 at the rear surface 2B shall be referred to as a peripheral edge portion 90. When viewed from the direction of a normal orthogonal to the element forming surface 2A (rear surface 2B), the peripheral edge portion 85 and the peripheral edge portion 90 are overlapped (see FIG. 1C described below).

As surfaces besides the element forming surface 2A and the rear surface 2B, the substrate 2 has a plurality of side surfaces (a side surface 2C, a side surface 2D, a side surface 2E, and a side surface 2F). The plurality of side surfaces extend so as to intersect (specifically, so as to be orthogonal to) each of the element forming surface 2A and the rear surface 2B and join the element forming surface 2A and the rear surface 2B.

The side surface 2C is constructed between the short sides 82 at one side in the long direction (the front left side in FIG. 1A) of the element forming surface 2A and the rear surface 2B, and the side surface 2D is constructed between the short sides 82 at the other side in the long direction (the inner right side in FIG. 1A) of the element forming surface 2A and the rear surface 2B. The side surfaces 2C and 2D are the respective end surfaces of the substrate 2 in the long direction. The side surface 2E is constructed between the long sides 81 at one side in the short direction (the inner left side in FIG. 1A) of the element forming surface 2A and the rear surface 2B, and the side surface 2F is constructed between the long sides 81 at the other side in the short direction (the front right side in FIG. 1A) of the element forming surface 2A and the rear surface 2B. The side surfaces 2E and 2F are the respective end surfaces of the substrate 2 in the short direction. Each of the side surface 2C and the side surface 2D intersects (specifically, is orthogonal to) each of the side surface 2E and the side surface 2F. Mutually adjacent surfaces among the element forming surface 2A to side surface 2F thus form a right angle.

With the substrate 2, the respective entireties of the element forming surface 2A and the side surfaces 2C to 2F are covered by a passivation film 23. Therefore to be exact, the respective entireties of the element forming surface 2A and the side surfaces 2C to 2F in FIG. 1A are positioned at the inner sides (rear sides) of the passivation film 23 and are not exposed to the exterior. The chip resistor 1 further has a resin film 24. The resin film 24 covers the entirety (the peripheral edge portion 85 and a region at the inner side thereof) of the passivation film 23 on the element forming surface 2A. The passivation film 23 and the resin film 24 shall be described in detail later.

Each of the first connection electrode 3 and the second connection electrode 4 is formed integrally on the element forming surface 2A of the substrate 2 so as to extend from the element forming surface 2A to the corresponding side surfaces 2C to 2F and thereby cover the peripheral edge portion 85. Each of the first connection electrode 3 and the second connection electrode 4 is arranged by laminating, for example, Ni (nickel), Pd (palladium), and Au (gold) in that order on the element forming surface 2A. The first connection electrode 3 and the second connection electrode 4 are disposed across an interval from each other in the long direction of the element forming surface 2A. At this arrangement position, the first connection electrode 3 is formed to integrally cover the three side surfaces 2C, 2E, and 2F along one short side 82 (the short side 82 at the side surface 2C side) of the chip resistor 1 and the pair of long sides 81 at respective sides thereof. On the other hand, the second connection electrode 4 is formed to integrally cover the three side surfaces 2D, 2E, and 2F along the other short side 82 (the short side 82 at the side surface 2D side) of the chip resistor 1 and the pair of long sides 81 at respective sides thereof. Respective corner portions 11 at which the side surfaces intersect each other at respective end portions in the long direction of the substrate 2 are thereby covered respectively by the first connection electrode 3 and the second connection electrode 4.

The first connection electrode 3 and the second connection electrode 4 are substantially the same in dimensions and same in shape in a plan view of looking from the direction of the normal. The first connection electrode 3 has a pair of long sides 3A and short sides 3B that form four sides in a plan view. The long sides 3A and the short sides 3B are orthogonal in a plan view. The second connection electrode 4 has a pair of long sides 4A and short sides 4B that form four sides in a plan view. The long sides 4A and the short sides 4B are orthogonal in a plan view. The long sides 3A and the long sides 4A extend in parallel to the short sides 82 of the substrate 2, and the short sides 3B and the short side 4B extend in parallel to the long sides 81 of the substrate 2. Also, the chip resistor 1 does not have an electrode at the rear surface 2B.

The element 5 is a circuit element, is formed in a region of the element forming surface 2A of the substrate 2 between the first connection electrode 3 and the second connection electrode 4, and is covered from above by the passivation film 23 and the resin film 24. The element 5 of the present preferred embodiment is a resistor portion 56. The resistor portion 56 is arranged by a circuit network in which a plurality of (unit) resistor bodies R, having an equal resistance value, are arrayed in a matrix on the element forming surface 2A. The resistor bodies R are made of TiN (titanium nitride) or TiON (titanium oxide nitride) or TiSiON. The element 5 is electrically connected to wiring films 22, to be described below, and is electrically connected to the first connection electrode 3 and the second connection electrode 4 via the wiring films 22. The element 5 is thus formed on the substrate 2 and is connected between the first connection electrode 3 and the second connection electrode 4.

Figure 1B:
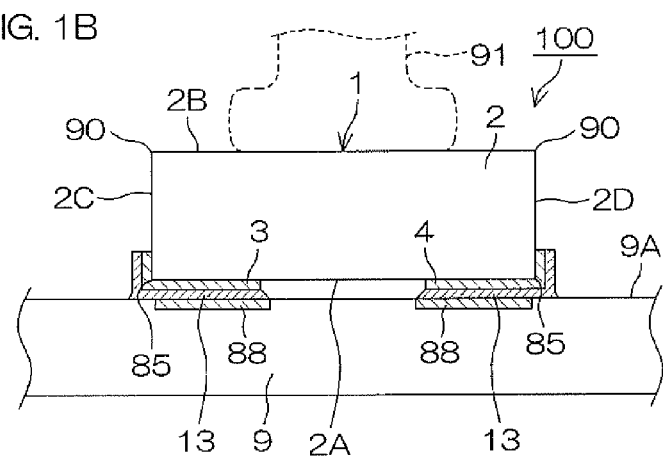
FIG. 1B is a schematic sectional view, taken along a long direction of the chip resistor, of a circuit assembly in a state where the chip resistor is mounted on a mounting substrate.

FIG. 1B is a schematic sectional view, taken along a long direction of the chip resistor, of a circuit assembly in a state where the chip resistor is mounted on a mounting substrate. Only principal portions are shown in section in FIG. 1B.

The chip resistor 1 is mounted on the mounting substrate 9 as shown in FIG. 1B. The chip resistor 1 and the mounting substrate 9 in this state constitute the circuit assembly 100. An upper surface of the mounting substrate 9 in FIG. 1B is a mounting surface 9A. A pair (two) of lands 88, connected to an internal circuit (not shown) of the mounting substrate 9, are formed on the mounting surface 9A. Each land 88 is formed, for example, of Cu. On a front surface of each land 88, a solder 13 is provided so as to project from the front surface.

In mounting the chip resistor 1 on the mounting substrate 9, the rear surface 2B of the chip resistor 1 is suctioned onto a suction nozzle 91 of an automatic mounting machine (not shown) and then the suction nozzle 91 is moved to convey the chip resistor 1. In this process, a substantially central portion in the long direction of the rear surface 2B is suctioned onto the suction nozzle 91. As mentioned above, the first connection electrode 3 and the second connection electrode 4 are formed only on the element forming surface 2A side end portions of a surface at one side (the element forming surface 2A) and the side surfaces 2C to 2F of the chip resistor 1, and therefore the rear surface 2B of the chip resistor 1 is a flat surface without electrodes (unevenness). The flat rear surface 2B can thus be suctioned onto the suction nozzle 91 when moving the chip resistor 1 upon being suctioned by the suction nozzle 91. In other words, with the flat rear surface 2B, a margin of the portion enabling suction by the suction nozzle 91 can be increased. The chip resistor 1 can thereby be suctioned reliably onto the suction nozzle 91 and the chip resistor 1 can be conveyed reliably without dropping off from the suction nozzle 91 in the middle.

The suction nozzle 91 with the chip resistor 1 suctioned thereon is then moved to the mounting substrate 9. At this point, the element forming surface 2A of the chip resistor 1 and the mounting surface 9A of the mounting substrate 9 face each other. In this state, the suction nozzle 91 is moved and pressed against the mounting substrate 9 so that, with the chip resistor 1, the first connection electrode 3 is contacted with the solder 13 on one land 88 and the second connection electrode 4 is contacted with the solder 13 on the other land 88. The solders 13 are then heated so that the solders 13 melt. Thereafter, when the solders 13 are cooled and solidified, the first connection electrode 3 and the one land 88 become bonded via the solder 13 and the second connection electrode 4 and the other land 88 become bonded via the solder 13. That is, each of the two lands 88 is solder-bonded to the corresponding electrode among the first connection electrode 3 and the second connection electrode 4. Mounting (flip-chip connection) of the chip resistor 1 to the mounting substrate 9 is thereby completed and the circuit assembly 100 is completed. The first connection electrode 3 and the second connection electrode 4 that function as the external connection electrodes are preferably formed of gold (Au) or has gold plating applied on the front surfaces thereof as shall be described below to improve solder wettability and improve reliability.

In the circuit assembly 100 in the completed state, the element forming surface 2A of the chip resistor 1 and the mounting surface 9A of the mounting substrate 9 extend parallel while facing each other across a gap (see also FIG. 1C). The dimension of the gap corresponds to the total of the thickness of the portion of the first connection electrode 3 or the second connection electrode 4 projecting from the element forming surface 2A and the thickness of the solders 13.

FIG. 1C is a schematic plan view, as viewed from the element forming surface side, of the chip resistor in the state of being mounted on the mounting substrate. The mounting form of the chip resistor 1 shall now be described with reference to FIG. 1B and FIG. 1C.

First, as shown in FIG. 1B, in a sectional view, each of the first connection electrode 3 and the second connection electrode 4 is, for example, formed to an L-like shape with a front surface portion on the element forming surface 2A and a side surface portion on the side surface 2C or 2D being made integral. Therefore, when the circuit assembly 100 (to be accurate, the portion of bonding of the chip resistor 1 and the mounting substrate 9) is viewed from the direction of the normal to the mounting surface 9A (and the element forming surface 2A) (the direction orthogonal to these surfaces) as shown in FIG. 1C, the solder 13 bonding the first connection electrode 3 and the one land 88 is adsorbed not only to the front surface portion but also to the side surface portion of the first connection electrode 3. Similarly, the solder 13 bonding the second connection electrode 4 and the other land 88 is adsorbed not only to the front surface portion but also to the side surface portion of the second connection electrode 4. Therefore with the chip resistor 1, the first connection electrode 3 is formed to integrally cover the three side surfaces 2C, 2E, and 2F of the substrate 2, and the second connection electrode 4 is formed to integrally cover the three side surfaces 2D, 2E, and 2F of the substrate 2. That is, the electrodes are formed on the side surfaces 2C to 2F in addition to the element forming surface 2A of the substrate 2 and therefore the adhesion area for soldering the chip resistor 1 onto the mounting substrate 9 can be enlarged. Consequently, the amount of solder 13 adsorbed to the first connection electrode 3 and the second connection electrode 4 can be increased to improve the adhesion strength.

Also as shown in FIG. 1C, the solder 13 is adsorbed so as to extend from the element forming surface 2A to the side surfaces 2C to 2F of the substrate 2. Therefore in the mounted state, all of the side surfaces 2C to 2F of the rectangular chip resistor 1 can be fixed by the solder 13 by the holding of the first connection electrode 3 by the solder 13 at the three side surfaces 2C, 2E, and 2F and the holding of the second connection electrode 4 by the solder 13 at the three side surfaces 2D, 2E, and 2F. The mounting form of the chip resistor 1 can thus be stabilized.

Another arrangement of the chip resistor 1 shall mainly be described below.

Figure 2:
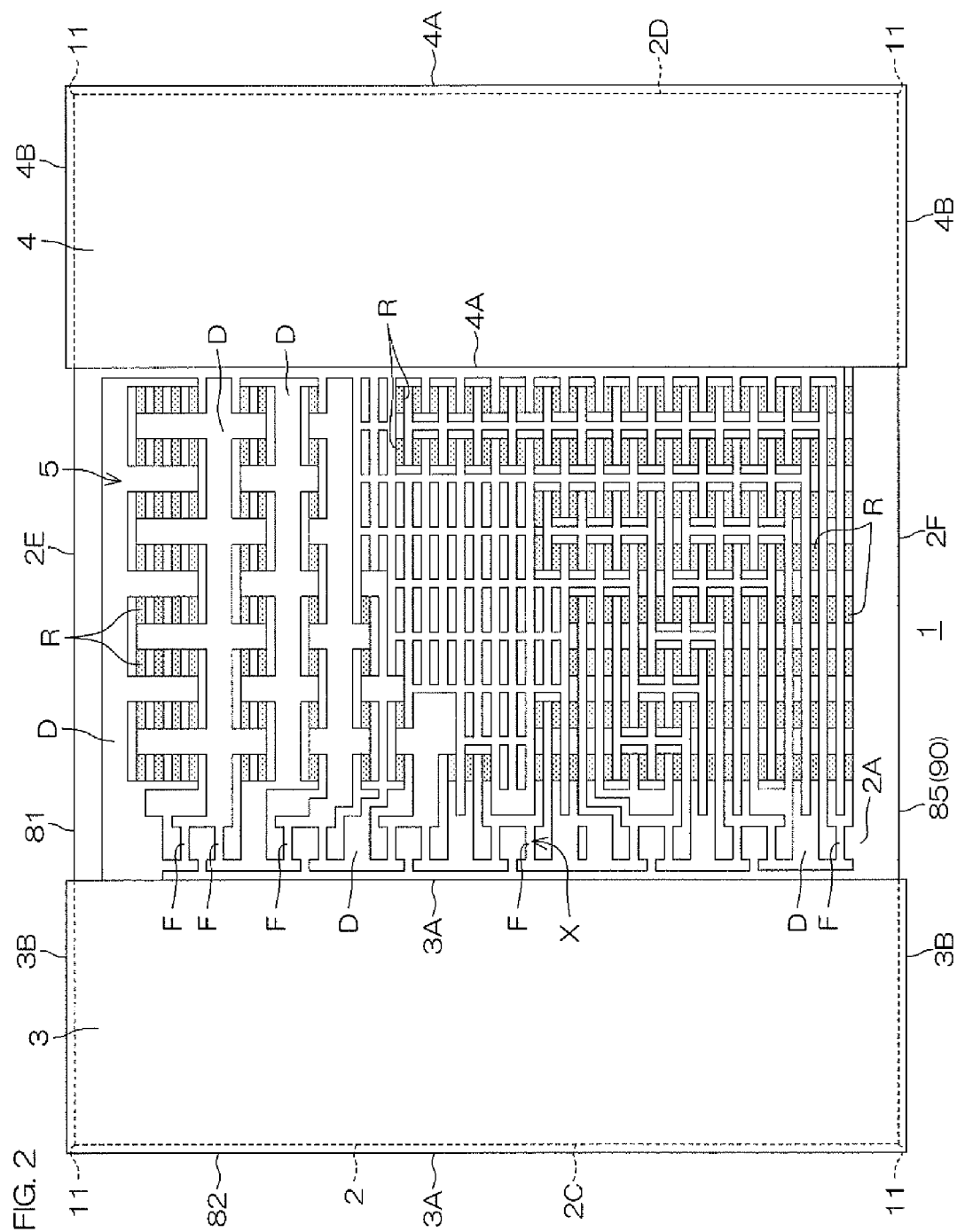
FIG. 2 is a plan view of a chip resistor showing the positional relationship of a first connection electrode, a second connection electrode, and an element and showing the arrangement in a plan view of the element.

FIG. 2 is a plan view of a chip resistor showing the positional relationship of a first connection electrode, a second connection electrode, and an element and showing the arrangement (layout pattern) in a plan view of the element.

With reference to FIG. 2, the element 5 is a resistor network. Specifically, the element 5 has a total of 352 resistor bodies R arranged from 8 resistor bodies R arrayed along the row direction (length direction of the substrate 2) and 44 resistor bodies R arrayed along the column direction (width direction of the substrate 2). The resistor bodies R are the plurality of element components that constitute the resistor network of the element 5.

The plurality of resistor bodies R are electrically connected in groups of predetermined numbers of 1 to 64 each to form a plurality of types of resistor circuits. The plurality of types of resistor circuits thus formed are connected in predetermined modes by conductor films D (wiring films formed of a conductor). Further, on the element forming surface 2A of the substrate 2, a plurality of fuses F are provided that are capable of being cut (fused) to electrically incorporate resistor circuits into the element 5 or electrically separate resistor circuits from the element 5. The plurality of fuses F and the conductor films D are arrayed along the inner side of the first connection electrode 3 so that the positioning regions thereof are rectilinear. More specifically, the plurality of fuses F and the conductor films D are disposed adjacently and the direction of alignment thereof is rectilinear. The plurality of fuses F connect each of the plurality of types of resistor circuits (each of the pluralities of resistor bodies R of the respective resistor circuits) to the first connection electrode 3 so as to enable cutting (enabling disconnection).

Figure 3C:
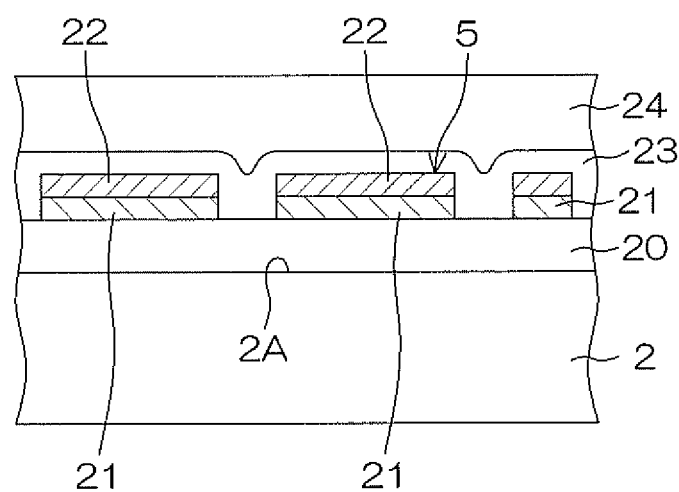
FIG. 3C is a vertical sectional view in the width direction taken along C-C of FIG. 3A for describing the arrangement of the resistor bodies in the element.

FIG. 3A is a partially enlarged plan view of the element shown in FIG. 2. FIG. 3B is a vertical sectional view in the length direction taken along B-B of FIG. 3A for describing the arrangement of resistor bodies in the element. FIG. 3C is a vertical sectional view in the width direction taken along C-C of FIG. 3A for describing the arrangement of the resistor bodies in the element.

The arrangement of the resistor bodies R shall now be described with reference to FIG. 3A, FIG. 3B, and FIG. 3C.

Besides the wiring films 22, the passivation film 23, and the resin film 24, the chip resistor 1 further includes an insulating film 20 and a resistor body film 21 (see FIG. 3B and FIG. 3C). The insulating film 20, the resistor body film 21, the wiring films 22, the passivation film 23, and the resin film 24 are formed on the substrate 2 (element forming surface 2A).

The insulating film 20 is made of $SiO_2$ (silicon oxide). The insulating film 20 covers the entirety of the element forming surface 2A of the substrate 2. The thickness of the insulating film 20 is approximately 10000 Å.

The resistor body film 21 is formed on the insulating film 20. The resistor body film 21 is formed of TiN, TiON, or TiSiON. The thickness of the resistor body film 21 is approximately 2000 Å. The resistor body film 21 is arranged as a plurality of resistor body films (hereinafter referred to as "resistor body film lines 21A") extending in parallel and rectilinearly between the first connection electrode 3 and the second connection electrode 4, and there are cases where a resistor body film line 21A is cut at predetermined positions in the line direction (see FIG. 3A).

The wiring films 22 are laminated on the resistor body film lines 21A. The wiring films 22 are made of Al (aluminum) or an alloy (AlCu alloy) of aluminum and Cu (copper). The thickness of each wiring film 22 is approximately 8000 Å. The wiring films 22 are laminated on the resistor body film lines 21A at fixed intervals R in the line direction and are in contact with the resistor body film lines 21A.

Figure 4A:
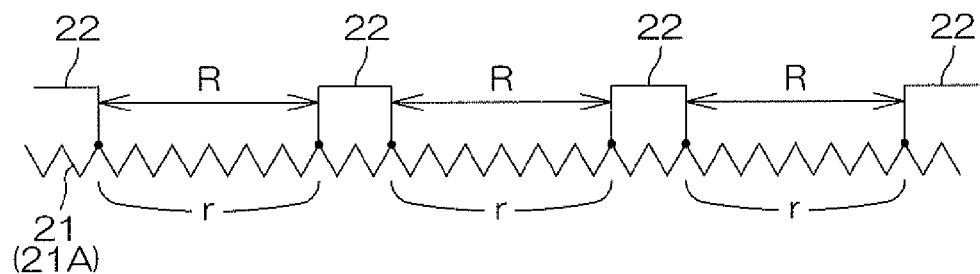
FIG. 4 shows diagrams showing the electrical features of resistor body film lines and conductor films in the form of circuit symbols and an electric circuit diagram.

The electrical features of the resistor body film lines 21A and the wiring films 22 of this arrangement are indicated by circuit symbols in FIG. 4. That is, as shown in FIG. 4A, each of the resistor body film line 21A portions in regions of the predetermined interval R forms a single resistor body R with a fixed resistance value r.

Figure 4B:
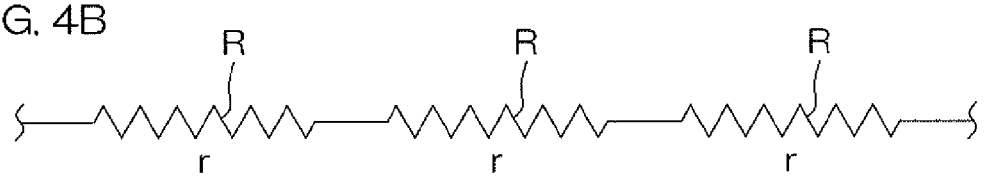

In each region at which the wiring film 22 is laminated, the wiring film 22 electrically connects mutually adjacent resistor bodies R so that the resistor body film line 21A is short-circuited by the wiring film 22. A resistor circuit, made up of serial connections of resistor bodies R of resistance r, is thus formed as shown in FIG. 4B.

Figure 4C:
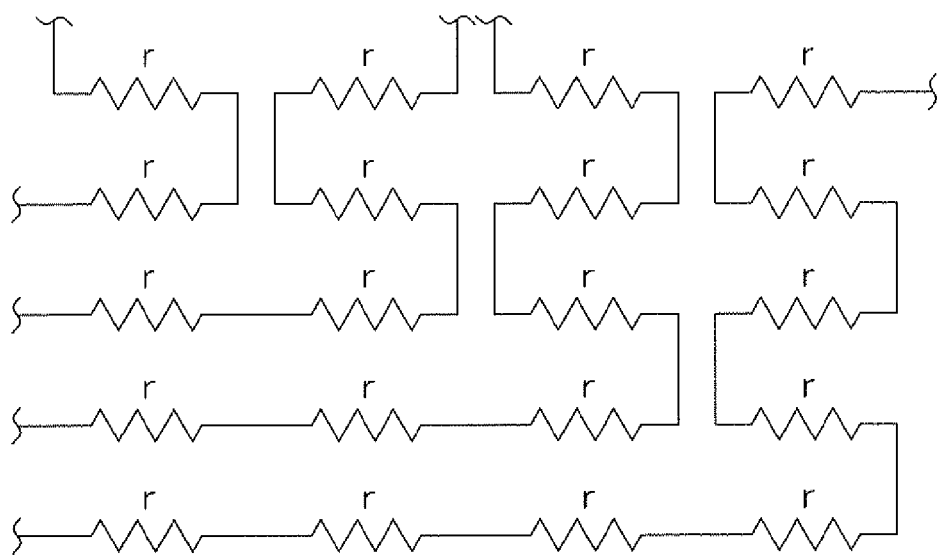

Also, adjacent resistor body film lines 21A are connected to each other by the resistor body film 21 and the wiring film 22, and the resistor network of the element 5 shown in FIG. 3A thus constitutes the resistor circuits (made up of the unit resistors of the resistor bodies R) shown in FIG. 4C. The resistor body film 21 and the wiring films 22 thus constitute the resistor bodies R and the resistor circuits (that is, the element 5). Each resistor body R includes a resistor body film line 21A (resistor body film 21) and a plurality of wiring films 22 laminated at the fixed interval in the line direction on the resistor body film line 21A, and the resistor body film line 21A of the fixed interval R portion on which the wiring film 22 is not laminated constitutes a single resistor body R. The resistor body film lines 21A at the portions constituting the resistor bodies R are all equal in shape and size. The multiple resistor bodies R arrayed in a matrix on the substrate 2 thus have an equal resistance value.

Also, the wiring films 22 laminated on the resistor body film lines 21A form the resistor bodies R and also serve the role of conductor films D that connect a plurality of resistor bodies R to arrange a resistor circuit (see FIG. 2).

Figures 5A, 5B:
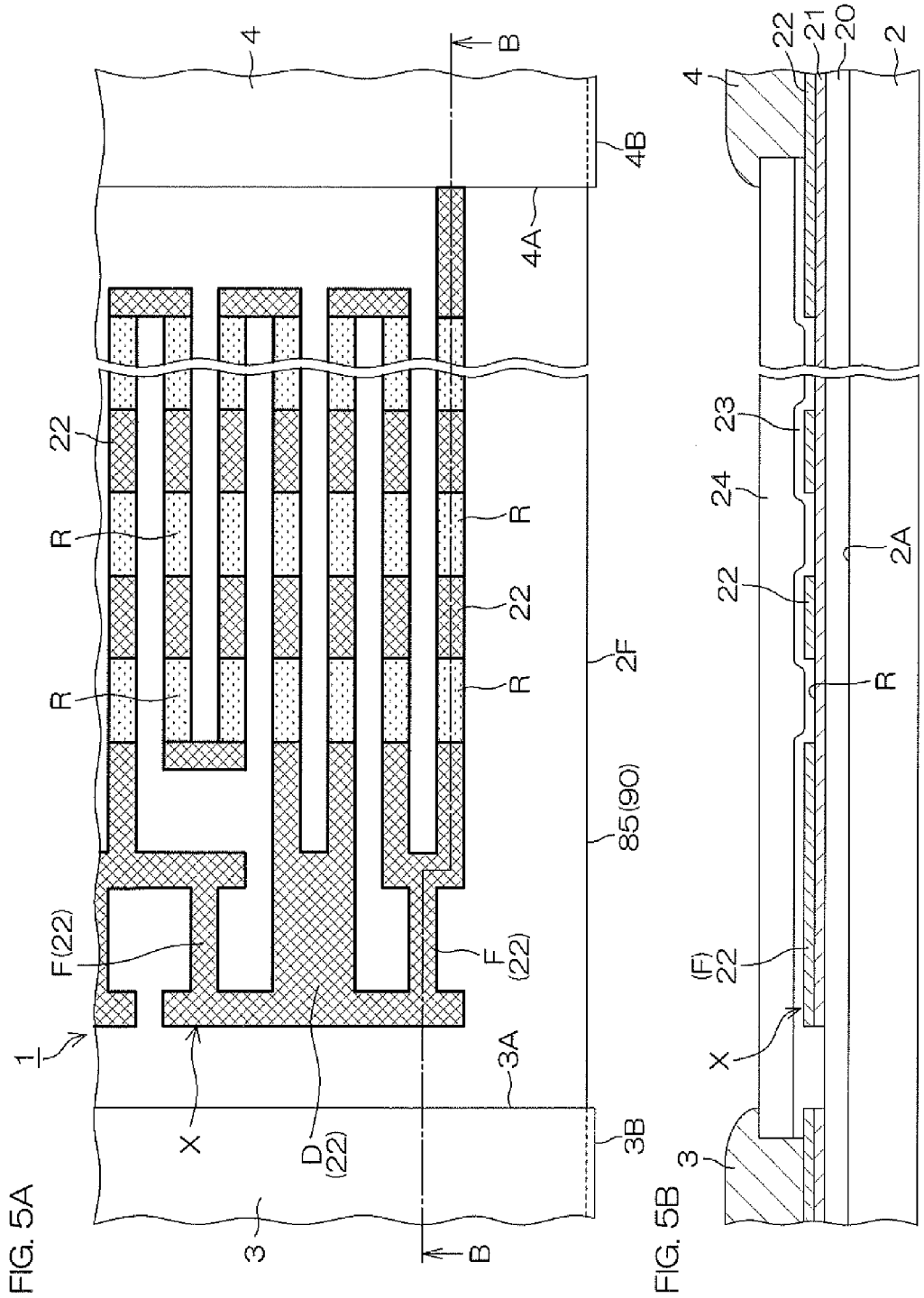
FIG. 5A is a partially enlarged plan view of a region including fuses drawn by enlarging a portion of the plan view of the chip resistor shown in FIG. 2.
FIG. 5B is a structural sectional view taken along B-B in FIG. 5A.

FIG. 5A is a partially enlarged plan view of a region including the fuses drawn by enlarging a portion of the plan view of the chip resistor shown in FIG. 2, and FIG. 5B is a structural sectional view taken along B-B in FIG. 5A.

As shown in FIGS. 5A and 5B, the fuses F and the conductor films D are also formed by the wiring films 22, which are laminated on the resistor body film 21 that forms the resistor bodies R. That is, the fuses F and the conductor films D are formed of Al or AlCu alloy, which is the same metal material as that of the wiring films 22, at the same layer as the wiring films 22, which are laminated on the resistor body film lines 21A that form the resistor bodies R. As mentioned above, the wiring films 22 are also used as the conductor films D that electrically connect a plurality of resistor bodies R to form a resistor circuit.

That is, at the same layer laminated on the resistor body film 21, the wiring films for forming the resistor bodies R, the fuses F, the conductor films D, and the wiring films for connecting the element 5 to the first connection electrode 3 and the second connection electrode 4 are formed as the wiring films 22 using the same metal material (Al or AlCu alloy). The fuses F are differed (distinguished) from the wiring films 22 because the fuses F are formed narrowly to enable easy cutting and because the fuses F are disposed so that other circuit components are not present in the surroundings thereof.

Here, a region of the wiring films 22 in which the fuses F are disposed shall be referred to as a trimming region X (see FIG. 2 and FIG. 5A). The trimming region X is a rectilinear region along the inner side of the first connection electrode 3 and not only the fuses F but the conductor films D are also disposed in the trimming region X. Also, the resistor body film 21 is formed below the wiring films 22 in the trimming region X (see FIG. 5B). The fuses F are wirings that are greater in interwiring distance (are more separated from the surroundings) than portions of the wiring films 22 besides the trimming region X.

The fuse F may refer not only to a portion of the wiring films 22 but may also refer to an assembly (fuse element) of a portion of a resistor body R (resistor body film 21) and a portion of the wiring film 22 on the resistor body film 21.

Also, although only a case where the same layer is used for the fuses F as that used for the conductor films D has been described, the conductor films D may have another conductor film laminated further thereon to decrease the overall resistance value of the conductor films D. Even in this case, the fusing property of the fuses F is not degraded as long as a conductor film is not laminated on the fuses F.

Figure 6:
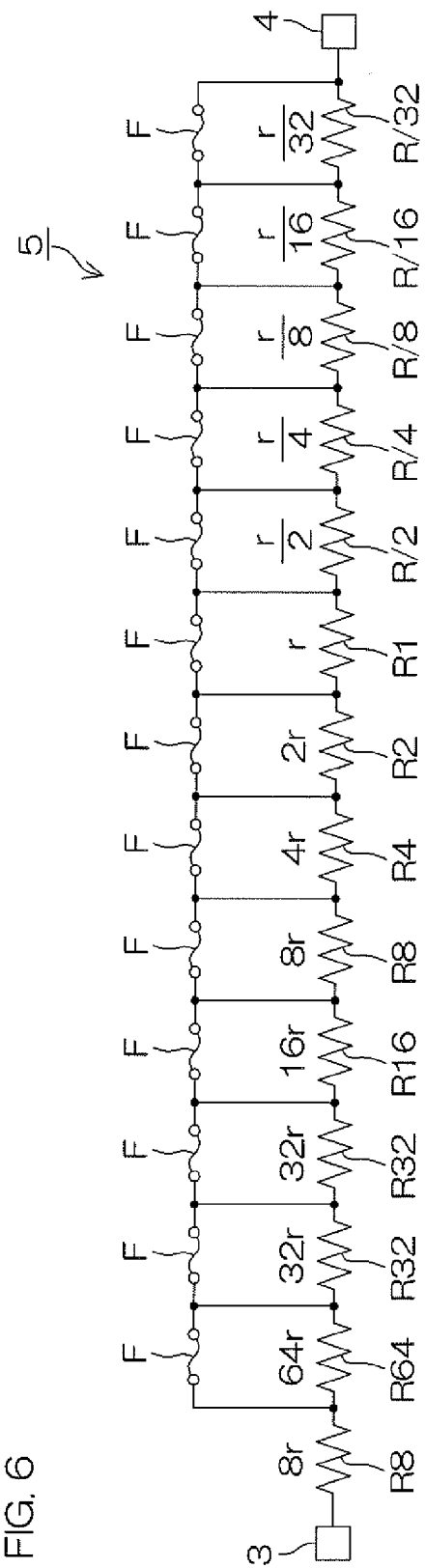
FIG. 6 is an electric circuit diagram of the element according to the preferred embodiment of the present invention.

FIG. 6 is an electric circuit diagram of the element according to the preferred embodiment of the present invention.

Referring to FIG. 6, the element 5 is arranged by serially connecting a reference resistor circuit R8, a resistor circuit R64, two resistor circuits R32, a resistor circuit R16, a resistor circuit R8, a resistor circuit R4, a resistor circuit R2, a resistor circuit R1, a resistor circuit R/2, a resistor circuit R/4, a resistor circuit R/8, a resistor circuit R/16, and a resistor circuit R/32 in that order from the first connection electrode 3. Each of the reference resistor circuit R8 and resistor circuits R64 to R2 is arranged by serially connecting the same number of resistor bodies R as the number at the end of its symbol ("64" in the case of R64). The resistor circuit R1 is arranged from a single resistor body R. Each of the resistor circuits R/2 to R/32 is arranged by connecting the same number of resistor bodies R as the number at the end of its symbol ("32" in the case of R/32) in parallel. The meaning of the number at the end of the symbol of the resistor circuit is the same in FIG. 7 and FIG. 8 to be described below.

One fuse F is connected in parallel to each of the resistor circuit R64 to resistor circuit R32, besides the reference resistor circuit R8. The fuses F are mutually connected in series directly or via the conductor films D (see FIG. 5A).

In a state where none of the fuses F is fused as shown in FIG. 6, the element 5 constitutes a resistor circuit of the reference resistor circuit R8 formed by the serial connection of the 8 resistor bodies R provided between the first connection electrode 3 and the second connection electrode 4. For example, if the resistance value r of a single resistor body R is r=8Ω, the chip resistor 1 is arranged with the first connection electrode 3 and the second connection electrode 4 being connected by the resistor circuit (the reference resistor circuit R8) of 8r=64Ω.

Also in the state where none of the fuses F is fused, the plurality of types of resistor circuits besides the reference resistor circuit R8 are put in short-circuited states. That is, although 13 resistor circuits R64 to R/32 of 12 types are connected in series to the reference resistor circuit R8, each resistor circuit is short-circuited by the fuse F that is connected in parallel and thus electrically, the respective resistor circuits are not incorporated in the element 5.

With the chip resistor 1 according to the present preferred embodiment, a fuse F is selectively fused, for example, by laser light in accordance with the required resistance value. The resistor circuit with which the fuse F connected in parallel is fused is thereby incorporated into the element 5. The overall resistance value of the element 5 can thus be set to the resistance value resulting from serially connecting and incorporating the resistor circuits corresponding to the fused fuses F.

In particular, the plurality of types of resistor circuits include the plurality of types of serial resistor circuits, with which the resistor bodies R having the equal resistance value are connected in series with the number of resistor bodies R being increased in geometric progression with a geometric ratio of 2 as 1, 2, 4, 8, 16, 32, . . . , and the plurality of types of parallel resistor circuits, with which the resistor bodies R having the equal resistance value are connected in parallel with the number of resistor bodies R being increased in geometric progression with a geometric ratio of 2 as 2, 4, 8, 16, . . . . Therefore by selectively fusing the fuses F (including the fuse elements), the overall resistance value of the element 5 (resistor portion 56) can be adjusted finely and digitally to an arbitrary resistance value to enable a resistance of a desired value to be formed in the chip resistor 1.

Figure 7:
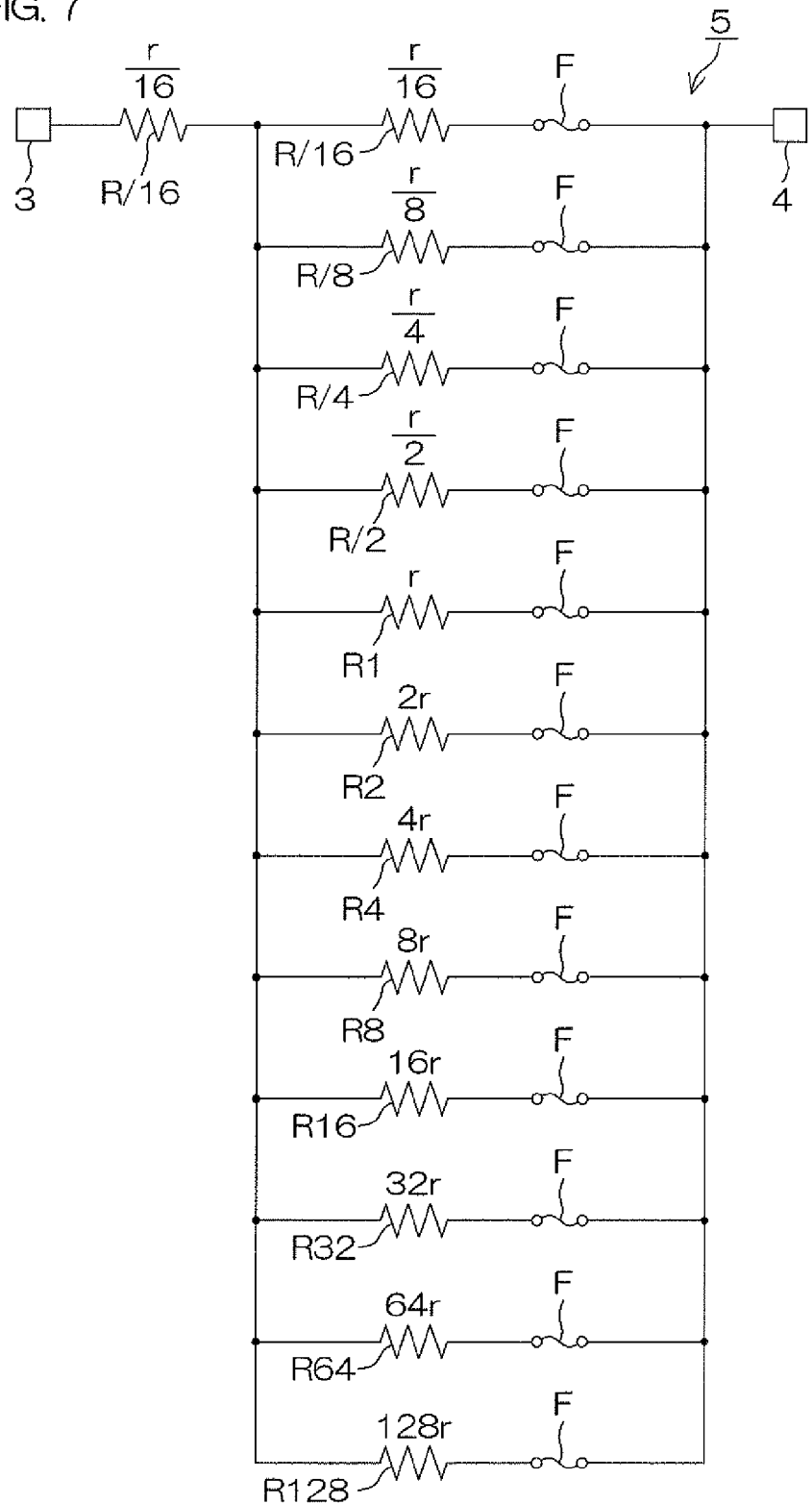
FIG. 7 is an electric circuit diagram of an element according to another preferred embodiment of the present invention.

FIG. 7 is an electric circuit diagram of an element according to another preferred embodiment of the present invention.

Instead of arranging the element 5 by serially connecting the reference resistor circuit R8 and the resistor circuit R64 to the resistor circuit R/32 as shown in FIG. 6, the element 5 may be arranged as shown in FIG. 7. Specifically, the element 5 may be arranged, between the first connection electrode 3 and the second connection electrode 4, as a serial connection circuit of the reference resistor circuit R/16 and the parallel connection circuit of the 12 types of resistor circuits R/16, R/8, R/4, R/2, R1, R2, R4, R8, R16, R32, R64, and R128.

In this case, a fuse F is serially connected to each of the 12 types of resistor circuits besides the reference resistor circuit R/16. In a state where none of the fuses F is fused, the respective resistor circuits are electrically incorporated in the element 5. By selectively fusing a fuse F, for example, by laser light in accordance with the required resistance value, the resistor circuit corresponding to the fused fuse F (the resistor circuit connected in series to the fuse F) is electrically separated from the element 5 and the overall resistance value of the chip resistor 1 can thereby be adjusted.

Figure 8:
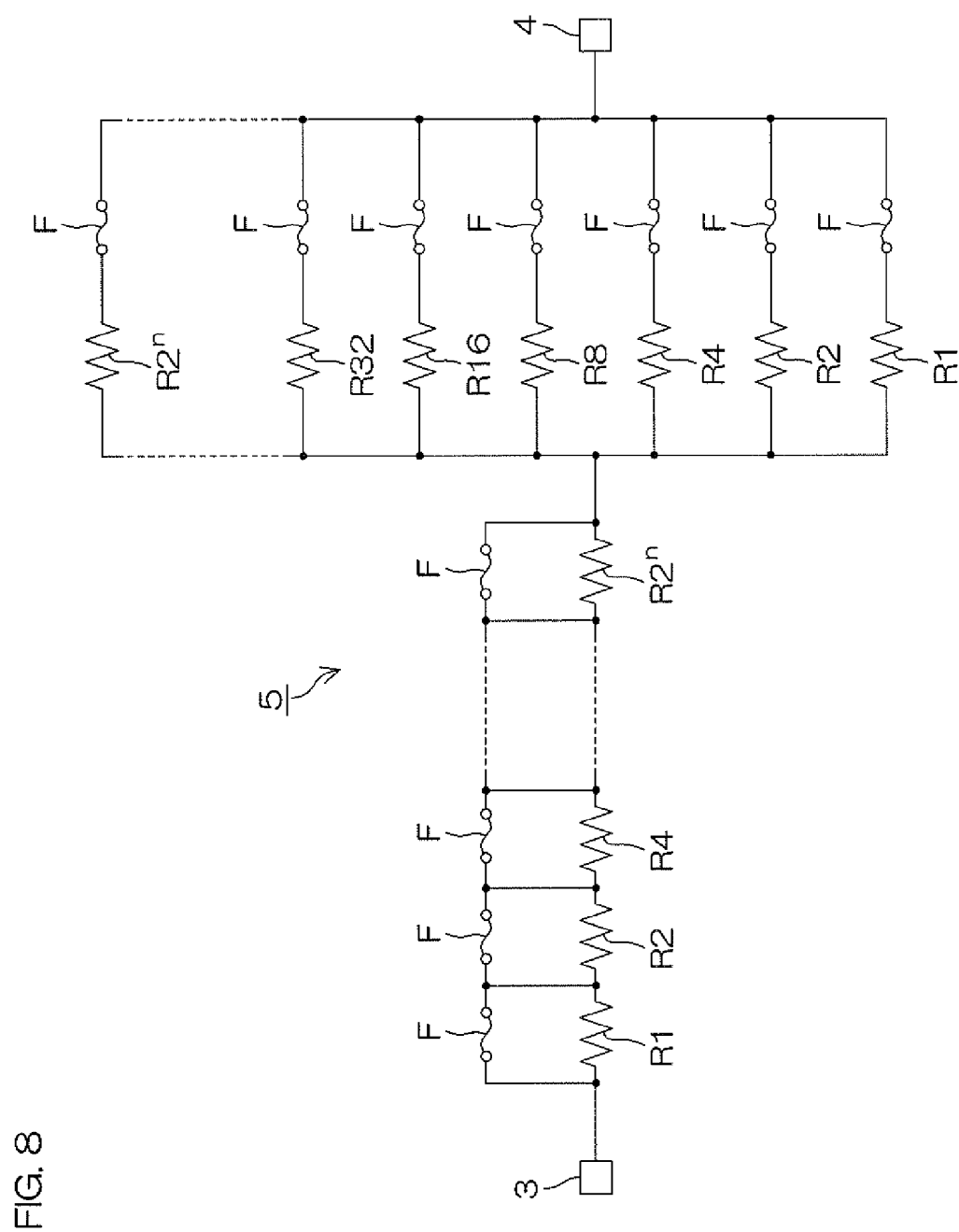
FIG. 8 is an electric circuit diagram of an element according to yet another preferred embodiment of the present invention.

FIG. 8 is an electric circuit diagram of an element according to yet another preferred embodiment of the present invention.

A feature of the element 5 shown in FIG. 8 is that it has the circuit arrangement where a serial connection of a plurality of types of resistor circuits and a parallel connection of a plurality of types of resistor circuits are connected in series. As in a previous preferred embodiment, with the plurality of types of resistor circuits connected in series, a fuse F is connected in parallel to each resistor circuit and all of the plurality of types of resistor circuits that are connected in series are put in short-circuited states by the fuses F. Therefore, when a fuse F is fused, the resistor circuit that was short-circuited by the fused fuse F is electrically incorporated into the element 5.

On the other hand, a fuse F is connected in series to each of the plurality of types of resistor circuits that are connected in parallel. Therefore by fusing a fuse F, the resistor circuit connected in series to the fused fuse F can be electrically disconnected from the parallel connection of resistor circuits.

With this arrangement, for example, by forming a low resistor portion of not more than 1 kΩ at the parallel connection side and forming a resistor circuit of not less than 1 kΩ at the serial connection side, resistor circuits of a wide range, from a low resistor portion of several Ω to a high resistor portion of several MΩ, can be formed using the resistor networks arranged with the same basic design. That is, with the chip resistor 1, a plurality of types of resistance values can be accommodated easily and rapidly by selecting and cutting one or a plurality of the fuses F. In other words, chip resistors 1 of various resistance values can be realized with a common design by combining a plurality of resistor bodies R that differ in resistance value.

With the chip resistor 1, the connection states of the plurality of resistor bodies R (resistor circuits) in the trimming region X can be changed as described above.

Figure 9:
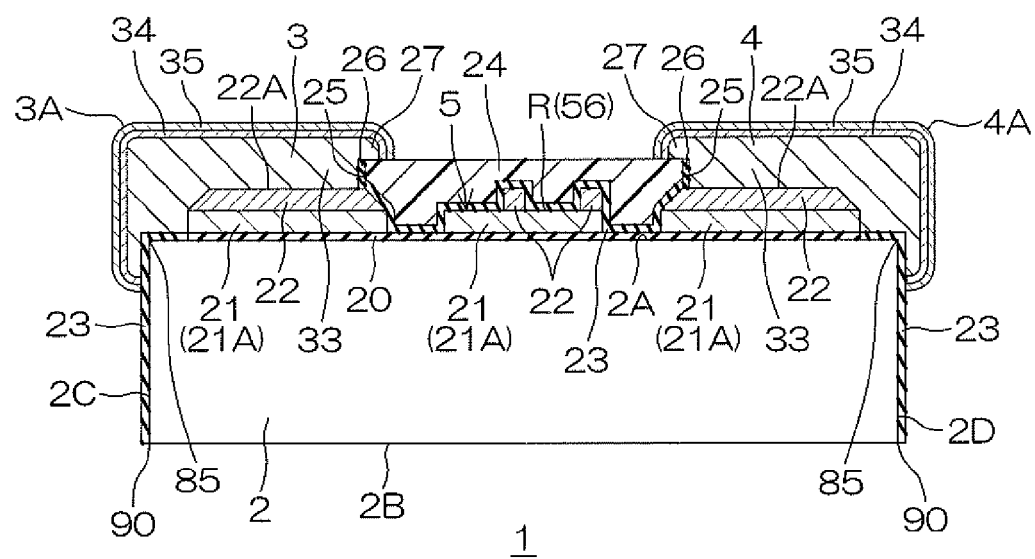
FIG. 9 is a schematic sectional view of the chip resistor.

FIG. 9 is a schematic sectional view of the chip resistor.

The chip resistor 1 shall now be described in further detail with reference to FIG. 9. For the sake of description, the element 5 is illustrated in a simplified form and hatching is applied to respective elements besides the substrate 2 in FIG. 9.

Here, the passivation film 23 and the resin film 24 shall be described.

The passivation film 23 is made, for example, from SiN (silicon nitride) and the thickness thereof is 1000 Å to 5000 Å (approximately 3000 Å here). The passivation film 23 is provided substantially across the respective entireties of the element forming surface 2A and the side surfaces 2C to 2F. The passivation film 23 on the element forming surface 2A covers the resistor body film 21 and the respective wiring films 22 on the resistor body film 21 (that is, the element 5) from the front surface (upper side in FIG. 9) and covers the upper surfaces of the respective resistor bodies R in the element 5. The passivation film 23 thus covers the wiring films 22 in the trimming region X as well (see FIG. 5B). Also, the passivation film 23 contacts the element 5 (the wiring films 22 and the resistor body film 21) and also contacts the insulating film 20 in regions besides the resistor body film 21. The passivation film 23 on the element forming surface 2A thus functions as a protective film that covers the entirety of the element forming surface 2A and protects the element 5 and the insulating film 20. Also at the element forming surface 2A, the passivation film 23 prevents short-circuiting across the resistor bodies R (short-circuiting across adjacent resistor body film lines 21A) at portions besides the wiring films 22.

On the other hand, the passivation film 23 provided on the respective side surfaces 2C to 2F is interposed between the side surface portions of the first connection electrode 3 and the second connection electrode 4 and the side surfaces 2C to 2F of the substrate 2 and functions as a protective layer that protects the respective side surfaces 2C to 2F. A requirement to avoid short-circuiting of the substrate 2 and the first connection electrode 3 or the second connection electrode 4 can thereby be answered. The passivation film 23 is an extremely thin film and therefore, in the present preferred embodiment, the passivation film 23 covering each of the side surfaces 2C to 2F shall be regarded as being a portion of the substrate 2. The passivation film 23 covering each of the side surfaces 2C to 2F shall thus be considered as being each of the side surfaces 2C to 2F itself.

The resin film 24, together with the passivation film 23, protects the element forming surface 2A of the chip resistor 1 and is made of a resin, such as polyimide, etc. The thickness of the resin film 24 is approximately 5 μm.

The resin film 24 covers the entirety of a front surface of the passivation film 23 on the element forming surface 2A (including the resistor body film 21 and the wiring films 22 covered by the passivation film 23).

In the resin film 24, notched portions 25 are formed, one each to respectively expose peripheral edge portions of the wiring films 22 that face side surface portions of the first connection electrode 3 and the second connection electrode 4. Each notched portion 25 penetrates continuously through each of the resin film 24 and the passivation film 23 in the thickness direction. The notched portions 25 are thus formed not only in the resin film 24 but also in the passivation film 23. Thereby with each wiring film 22, only an inner peripheral edge portion close to the element 5 is selectively covered by the resin film 24 and the other peripheral edge portion along the peripheral edge portion 85 of the substrate 2 is selectively exposed via the notched portion 25. The portions of the wiring films 22 exposed at the respective notched portions 25 are pad regions 22A for external connection. Also, on the element forming surface 2A, the wiring film 22 exposed from the notched portion 25 is positioned inwardly away from the peripheral edge portion 85 across a predetermined interval (for example of 3 μm to 6 μm). Also, an insulating film 26 is formed on an entirety of a side surface of each notched portion 25 from one short side 82 toward the other short side 82.

Of the two notched portions 25, one notched portion 25 is completely filled by the first connection electrode 3 and the other notched portion 25 is completely filled by the second connection electrode 4. As mentioned above, the first connection electrode 3 and the second connection electrode 4 are formed to cover the side surfaces 2C to 2F in addition to the element forming surface 2A. Also, each of the first connection electrode 3 and the second connection electrode 4 is formed to project from the front surface of the resin film 24 and has a lead-out portion 27 leading out to an inner side (element 5 side) of the substrate 2 along a front surface of the resin film 24.

Here, each of the first connection electrode 3 and the second connection electrode 4 has an Ni layer 33, a Pd layer 34, and an Au layer 35 in that order from the element forming surface 2A side and side surface 2C to 2F sides. That is, each of the first connection electrode 3 and the second connection electrode 4 has a laminated structure constituted of the Ni layer 33, the Pd layer 34, and the Au layer 35 not only in a region on the element forming surface 2A but also in regions on the side surfaces 2C to 2F. Therefore in each of the first connection electrode 3 and the second connection electrode 4, the Pd layer 34 is interposed between the Ni layer 33 and the Au layer 35. In each of the first connection electrode 3 and the second connection electrode 4, the Ni layer 33 takes up most of each connection electrode and the Pd layer 34 and the Au layer 35 are formed significantly thinner than the Ni layer 33. The Ni layer 33 serves a role of relaying between the Al of the wiring film 22 in the pad region 22A in each notched portion 25 and the solder 13 when the chip resistor 1 is mounted on the mounting substrate 9 (see FIG. 1B and FIG. 1C).

As described above, with the first connection electrode 3 and the second connection electrode 4, a front surface of the Ni layer 33 is covered by the Au layer 35 and the Ni layer 33 can thus be prevented from becoming oxidized. Also with the first connection electrode 3 and the second connection electrode 4, even if a penetrating hole (pinhole) forms in the Au layer 35 due to thinning of the Au layer 35, the Pd layer 34 interposed between the Ni layer 33 and the Au layer 35 closes the penetrating hole and the Ni layer 33 can thus be prevented from being exposed to the exterior through the penetrating hole and becoming oxidized.

With each of the first connection electrode 3 and the second connection electrode 4, the Au layer 35 is exposed at the frontmost surface. The first connection electrode 3 is electrically connected, via one notched portion 25, to the wiring film 22 in the pad region 22A in the notched portion 25. The second connection electrode 4 is electrically connected, via the other notched portion 25, to the wiring film 22 in the pad region 22A in the notched portion 25. With each of the first connection electrode 3 and the second connection electrode 4, the Ni layer 33 is connected to the pad region 22A. Each of the first connection electrode 3 and the second connection electrode 4 is thereby electrically connected to the element 5. Here, the wiring films 22 form wirings that are respectively connected to groups of resistor bodies R (resistor portion 56) and the first connection electrode 3 and the second connection electrode 4.

The resin film 24 and the passivation film 23, in which the notched portions 25 are formed, thus cover the element forming surface 2A in a state where the first connection electrode 3 and the second connection electrode 4 are exposed through the notched portions 25. Electrical connection between the chip resistor 1 and the mounting substrate 9 can thus be achieved via the first connection electrode 3 and the second connection electrode 4 that protrude (project) from the notched portions 25 at the front surface of the resin film 24 (see FIG. 1B and FIG. 1C).

FIG. 10A to FIG. 10I are illustrative sectional views of a method for producing the chip resistor shown in FIG. 9.

Figure 10A:
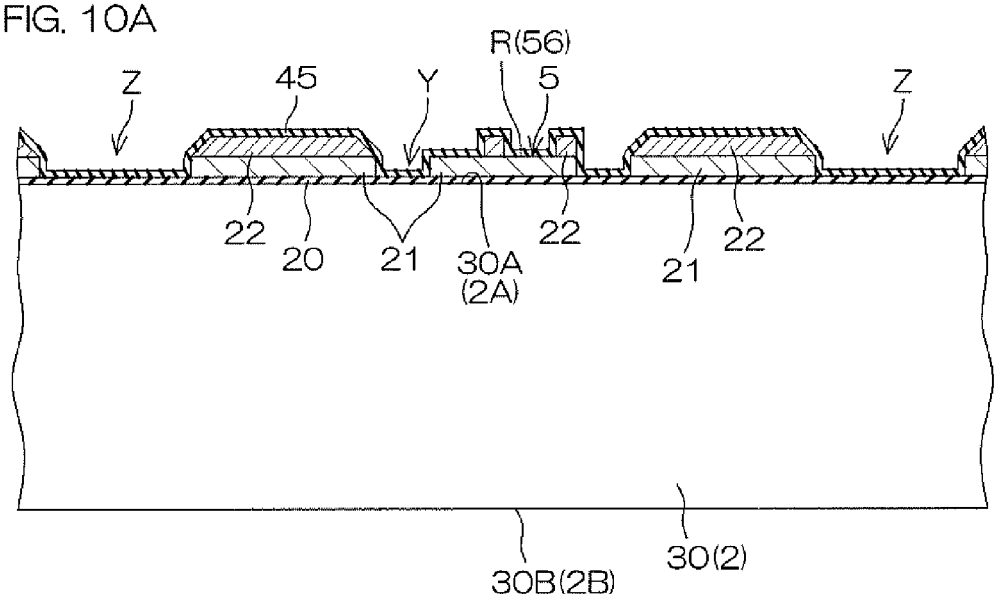
FIG. 10A is a sectional view of a method for producing the chip resistor shown in FIG. 9.

First, as shown in FIG. 10A, a substrate 30, which is to be the base of the substrate 2, is prepared. Here, a front surface 30A of the substrate 30 is the element forming surface 2A of the substrate 2 and a rear surface 30B of the substrate 30 is the rear surface 2B of the substrate 2.

The front surface 30A of the substrate 30 is then thermally oxidized to form the insulating film 20, made of $SiO_2$, etc., on the front surface 30A, and the element 5 (the resistor bodies R and the wiring films 22 connected to the resistor bodies R) is formed on the insulating film 20. Specifically, first, the resistor body film 21 of TiN, TiON, or TiSiON is formed by sputtering on the entire surface of the insulating film 20 and further, the wiring film 22 of aluminum (Al) is laminated on the resistor body film 21 so as to contact the resistor body film 21. Thereafter, a photolithography process is used and, for example, RIE (reactive ion etching) or other form of dry etching is performed to selectively remove and pattern the resistor body film 21 and the wiring film 22 to obtain the arrangement where, as shown in FIG. 3A, the resistor body film lines 21A of fixed width, at which the resistor body film 21 is laminated, are arrayed at fixed intervals in the column direction in a plan view. In this process, regions in which the resistor body film lines 21A and the wiring film 22 are cut at portions are also formed and the fuses F and the conductor films D are formed in the trimming region X (see FIG. 2). The wiring film 22 laminated on the resistor body film lines 21A is then removed selectively, for example, by wet etching. The element 5 of the arrangement where the wiring films 22 are laminated at the fixed intervals R on the resistor body film lines 21A is consequently obtained. In this process, the resistance value of the entirety of the element 5 may be measured to check whether or not the resistor body film 21 and the wiring film 22 have been formed to the targeted dimensions.

With reference to FIG. 10A, the elements 5 are formed at multiple locations on the front surface 30A of the substrate 30 in accordance with the number of chip resistors 1 that are to be formed on the single substrate 30. If a single region of the substrate 30 in which an element 5 (the resistor portion 56) is formed is referred to as a chip part region Y, a plurality of chip part regions Y (in other words, elements 5), each having the resistor portion 56, are formed (set) on the front surface 30A of the substrate 30. A single chip part region Y coincides with a single finished chip resistor 1 (see FIG. 9) in a plan view. On the front surface 30A of the substrate 30, a region between adjacent chip part regions Y shall be referred to as a "boundary region Z." The boundary region Z has a band shape and extends in a lattice in a plan view. A single chip part region Y is disposed in a single lattice cell defined by the boundary region Z. The width of the boundary region Z is 1 μm to 60 μm (for example, 20 μm) and is extremely narrow, and therefore a large number of chip part regions Y can be secured on the substrate 30 to consequently enable mass production of the chip resistors 1.

Thereafter as shown in FIG. 10A, an insulating film 45 made of SiN is formed on the entirety of the front surface 30A of the substrate 30 by a CVD (chemical vapor deposition) method. The insulating film 45 contacts and covers all of the insulating film 20 and the elements 5 (resistor body film 21 and wiring films 22) on the insulating film 20. The insulating film 45 thus also covers the wiring films 22 in the trimming regions X (see FIG. 2). Also, the insulating film 45 is formed across the entirety of the front surface 30A of the substrate 30 and is thus formed to extend to regions besides the trimming regions X on the front surface 30A. The insulating film 45 is thus a protective film that protects the entirety of the front surface 30A (including the elements 5 on the front surface 30A).

Figure 10B:
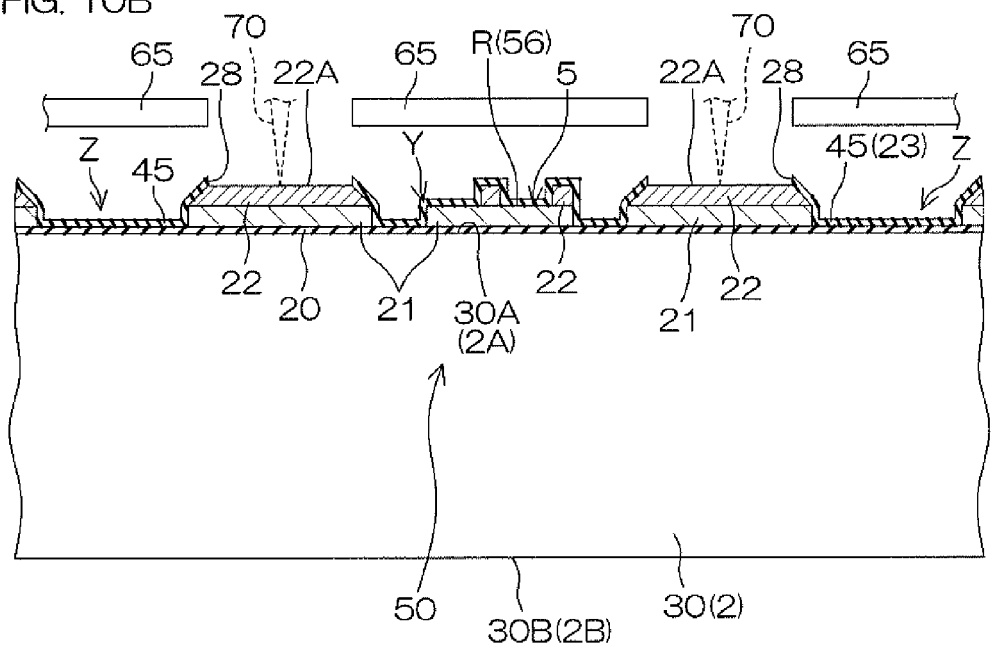
FIG. 10B is a sectional view of a step subsequent to that of FIG. 10A.

Thereafter as shown in FIG. 10B, the insulating film 45 is removed selectively by etching using a mask 65. Openings 28 are thereby formed in portions of the insulating film 45 and the respective pad regions 22A are exposed in the openings 28. Two openings 29 are formed per single semi-finished product 50.

With each semi-finished product 50, after the two openings 28 have been formed in the insulating film 45, probes 70 of a resistance measuring apparatus (not shown) are put in contact with the pad regions 22A in the respective openings 28 to detect the overall resistance value of the element 5. Laser light (not shown) is then irradiated onto an arbitrary fuse F (see FIG. 2) via the insulating film 45 to trim the wiring film 22 in the trimming region X by the laser light and thereby fuse the corresponding fuse F. By thus fusing (trimming) the fuses F so that the required resistance value is attained, the overall resistance value of the semi-finished product 50 (in other words, the chip resistor 1) can be adjusted, as described above. In this process, the insulating film 45 serves as a cover film that covers the element 5 and therefore the occurrence of a short circuit due to attachment of a fragment, etc., formed in the fusing process to the element 5 can be prevented. Also, the insulating film 45 covers the fuses F (the resistor body film 21) and therefore the energy of the laser light accumulates in the fuses F to enable the fuses F to be fused reliably. Thereafter, SiN is formed on the insulating film 45 by the CVD method to thicken the insulating film 45 as necessary. At the final stage, the insulating film 45 (in the state shown in FIG. 10C) has a thickness of 1000 Å to 5000 Å (approximately 3000 Å here). At this point, portions of the insulating film 45 enter inside the respective openings 28 to close the openings 28.

Figure 10C:
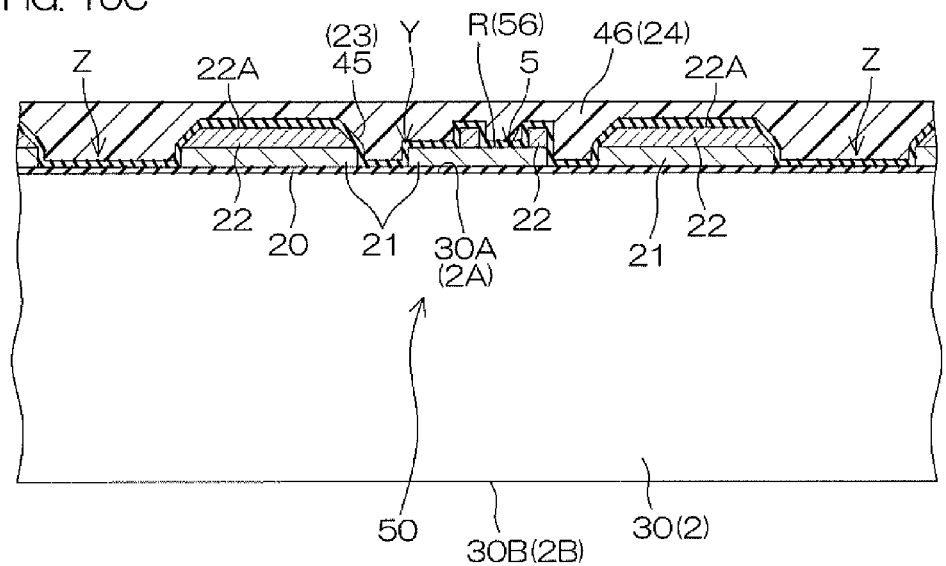
FIG. 10C is a sectional view of a step subsequent to that of FIG. 10B.

Thereafter, a liquid of a photosensitive resin constituted of polyimide is spray-coated onto the substrate 30 from above the insulating film 45 to form a resin film 46 of the photosensitive resin as shown in FIG. 10C. A front surface of the resin film 46 on the front surface 30A is formed flatly along the front surface 30A. Thereafter, heat treatment (curing) is performed on the resin film 46. The thickness of the resin film 46 is thereby made to undergo thermal contraction and the resin film 46 hardens and stabilizes in film quality.

Figure 10D:
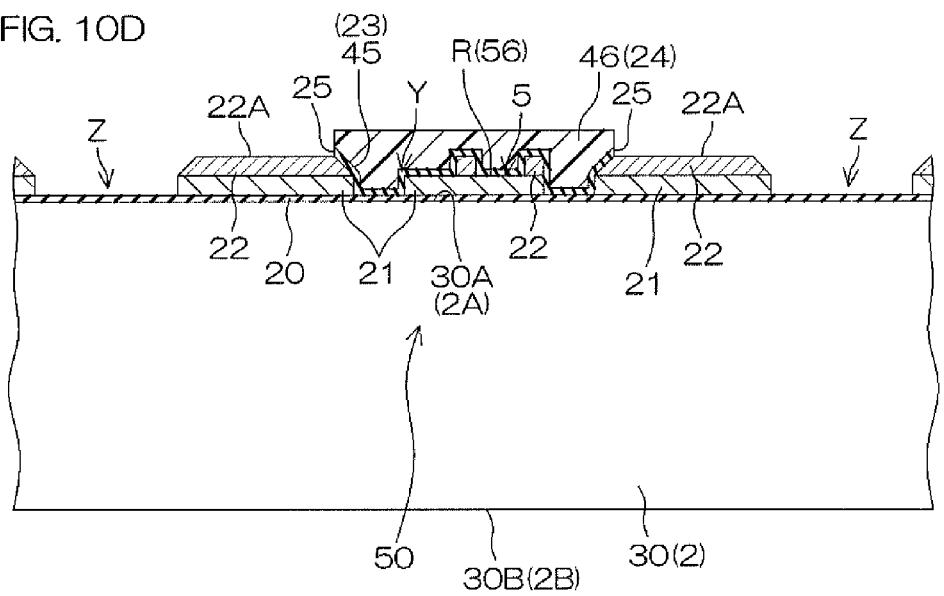
FIG. 10D is a sectional view of a step subsequent to that of FIG. 10C.

Thereafter as shown in FIG. 10D, the resin film 46, the insulating film 45, and the insulating film 20 are patterned to selectively remove portions of these films coinciding with the notched portions 25. The notched portions 25 are thereby formed and the front surface 30A (insulating film 20) is exposed in the boundary region Z.

Figure 10E:
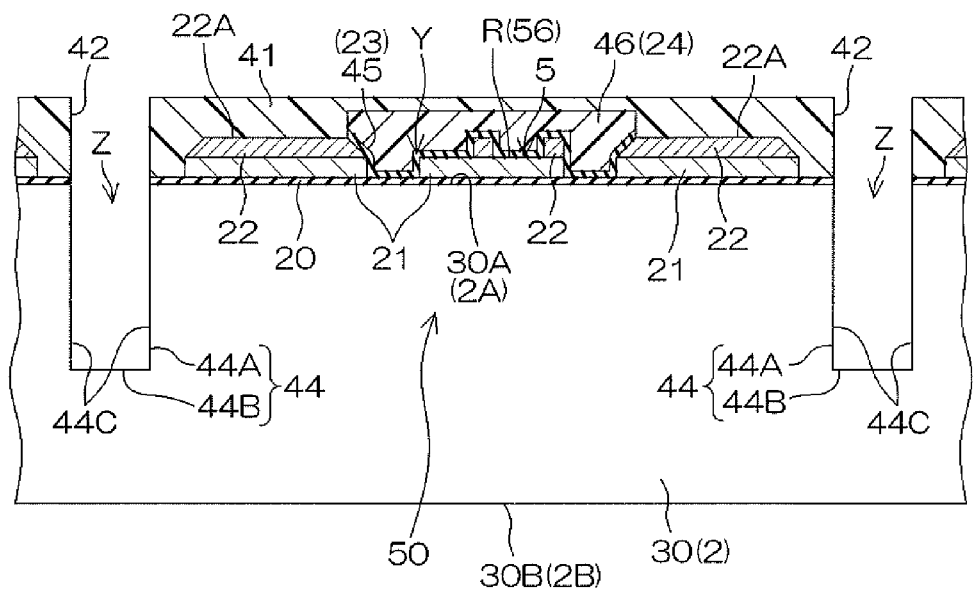
FIG. 10E is a sectional view of a step subsequent to that of FIG. 10D.

Thereafter a resist pattern 41 is formed across the entirety of the front surface 30A of the substrate 30 as shown in FIG. 10E. An opening 42 is formed in the resist pattern 41.

Figure 11:
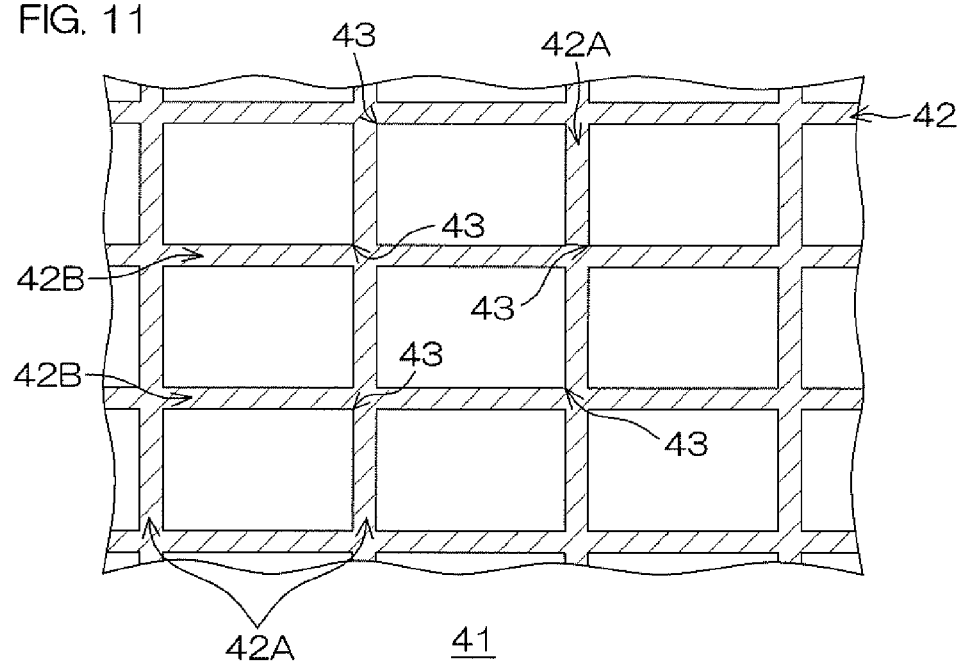
FIG. 11 is a schematic plan view of a portion of a resist pattern used for forming a groove in the step of FIG. 10E.

FIG. 11 is a schematic plan view of a portion of the resist pattern used for forming a groove in the step of FIG. 10E.

With reference to FIG. 11, the opening 42 of the resist pattern 41 coincides with (corresponds to) a region (hatched portion in FIG. 11, in other words, the boundary region Z) between outlines of mutually adjacent chip resistors 1 in a plan view in a case where multiple chip resistors 1 (in other words, the chip part regions Y) are disposed in an array (that is also a lattice). The overall shape of the opening 42 is thus a lattice having a plurality of mutually orthogonal rectilinear portions 42A and 42B.

In the resist pattern 41, the mutually orthogonal rectilinear portions 42A and 42B in the opening 42 are connected while being maintained in mutually orthogonal states (without curving). Intersection portions 43 of the rectilinear portions 42A and 42B are thus pointed and form angles of substantially 90° in a plan view.

Referring to FIG. 10E, the substrate 30 is removed selectively by plasma etching using the resist pattern 41 as a mask. The material of the substrate 30 is thereby removed at positions across intervals from the wiring films 22 in the boundary region Z between mutually adjacent elements 5 (chip part regions Y). Consequently, a groove 44, having a predetermined depth reaching a middle portion of the thickness of the substrate 30 from the front surface 30A of the substrate 30, is formed at positions (boundary region Z) coinciding with the opening 42 of the resist pattern 41 in a plan view. The groove 44 is defined by a pair of mutually facing side walls 44A and a bottom wall 44B joining the lower ends (ends at the rear surface 30B side of the substrate 30) of the pair of side walls 44A. The depth of the groove 44 on the basis of the front surface 30A of the substrate 30 is approximately 100 μm and the width of the groove 44 (interval between the mutually facing side walls 44A) is approximately 20 μm and is fixed across the entire depth direction.

The overall shape of the groove 44 in the substrate 30 is a lattice that coincides with the opening 42 (see FIG. 11) of the resist pattern 41 in a plan view. At the front surface 30A of the substrate 30, rectangular frame portions (boundary region Z) of the groove 44 surround the peripheries of the chip part regions Y in which the respective elements 5 are formed. In the substrate 30, each portion in which the element 5 is formed is a semi-finished product 50 of the chip resistor 1. At the front surface 30A of the substrate 30, one semi-finished product 50 is positioned in each chip part region Y surrounded by the groove 44, and these semi-finished products 50 are arrayed and disposed in an array. By thus forming the groove 44, the substrate 30 is separated into the substrates 2 according to the plurality of chip part regions Y. After the groove 44 has been formed, the resist pattern 41 is removed.

Figure 10F:
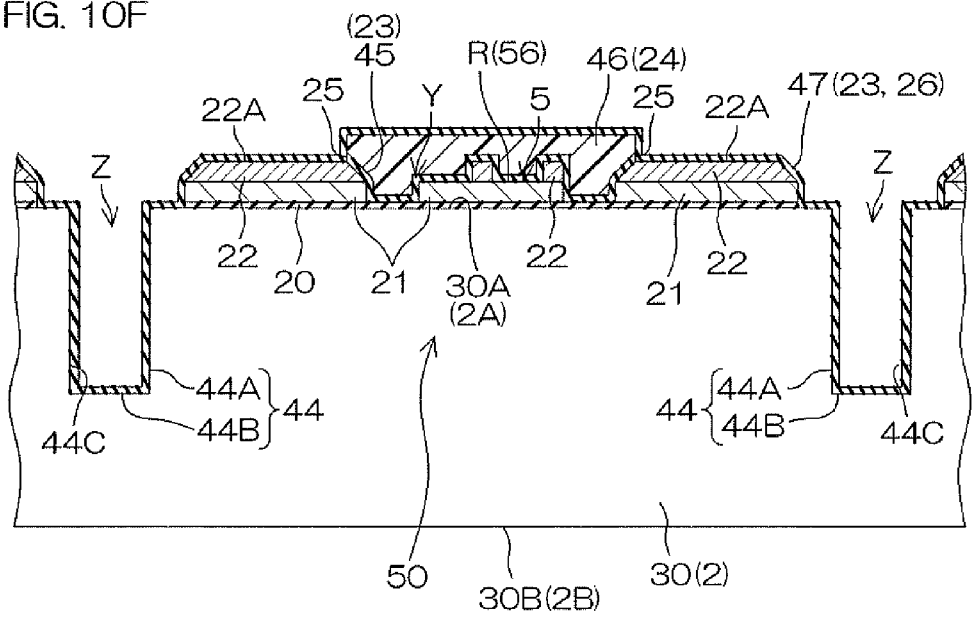
FIG. 10F is a sectional view of a step subsequent to that of FIG. 10E.
Figure 10:
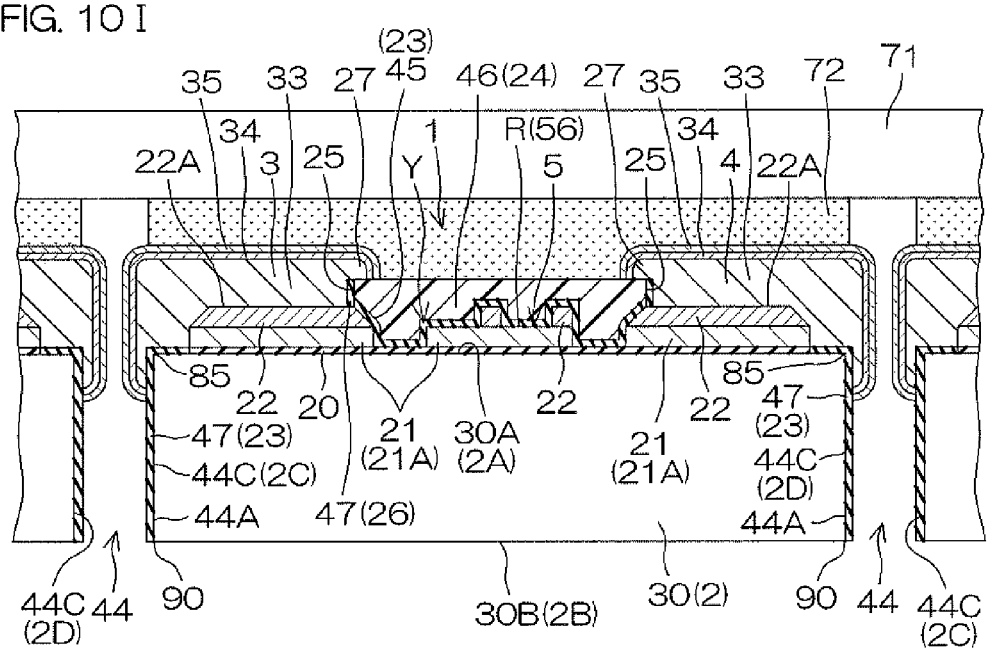
FIG. 10G is a sectional view of a step subsequent to that of FIG. 10F.
FIG. 10H is a sectional view of a step subsequent to that of FIG. 10G.
FIG. 10I is a sectional view of a step subsequent to that of FIG. 10H.

Thereafter as shown in FIG. 10F, an insulating film 47 made of SiN is formed on the entirety of the front surface 30A of the substrate 30 by the CVD method. In this process, the insulating film 47 is also formed on the entireties of inner peripheral surfaces (defining surfaces 44C of the side walls 44A and an upper surface of the bottom wall 44B) of the groove 44.

Thereafter, the insulating film 47 is selectively etched as shown in FIG. 10G. Specifically, portions of the insulating film 47 that are parallel to the front surface 30A are selectively etched. The pad regions 22A of the wiring films 22 are thereby exposed and in the groove 44, the insulating film 47 on the bottom wall 44B is removed.

Thereafter, by electroless plating, Ni, Pd, and Au are grown by plating in that order from the wiring films 22 exposed from the respective notched portions 25. The plating is continued until each plated film grows in a lateral direction along the front surface 30A and covers the insulating film 47 on the side walls 44A of the groove 44. The first connection electrode 3 and the second connection electrode 4, made of the Ni/Pd/Au laminated films, are thereby formed as shown in FIG. 10H.

Figure 12:
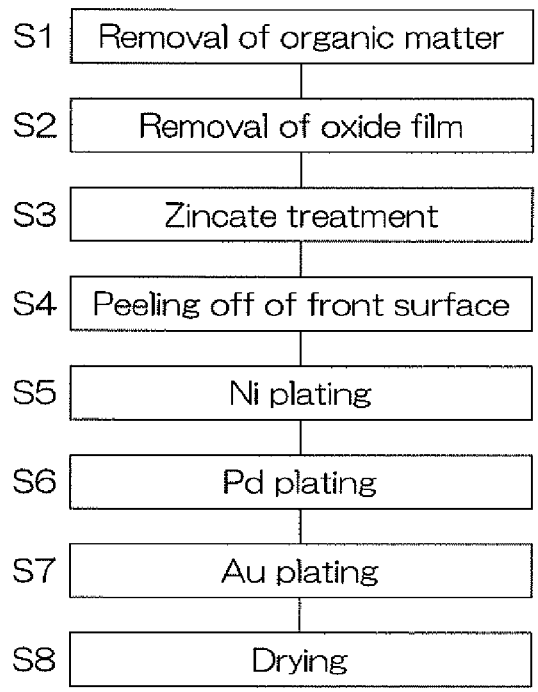
FIG. 12 is a diagram for describing a process for producing a first connection electrode and a second connection electrode.

FIG. 12 is a diagram for describing a process for producing the first connection electrode and the second connection electrode.

Specifically, with reference to FIG. 12, first, a front surface of each pad region 22A is cleaned to remove (degrease) organic matter (including smuts, such as stains of carbon, etc., and oil and fat dirt) on the front surface (step S1). Thereafter, an oxide film on the front surface is removed (step S2). Thereafter, a zincate treatment is performed on the front surface to convert the Al (of the wiring film 22) at the front surface to Zn (step S3). Thereafter, the Zn on the front surface is peeled off by nitric acid, etc., so that fresh Al is exposed at the pad region 22A (step S4).

Thereafter, the pad region 22A is immersed in a plating solution to apply Ni plating on a front surface of the fresh Al in the pad region 22A. The Ni in the plating solution is thereby chemically reduced and deposited to form the Ni layer 33 on the front surface (step S5).

Thereafter, the Ni layer 33 is immersed in another plating solution to apply Pd plating on a front surface of the Ni layer 33. The Pd in the plating solution is thereby chemically reduced and deposited to form the Pd layer 34 on the front surface of the Ni layer 33 (step S6).

Thereafter, the Pd layer 34 is immersed in yet another plating solution to apply Au plating on a front surface of the Pd layer 34. The Au in the plating solution is thereby chemically reduced and deposited to form the Au layer 35 on the front surface of the Pd layer 34 (step S7). The first connection electrode 3 and the second connection electrode 4 are thereby formed, and when the first connection electrode 3 and the second connection electrode 4 that have been formed are dried (step S8), the process for producing the first connection electrode 3 and the second connection electrode 4 is completed. A step of washing the semi-finished product 50 with water is performed as necessary between consecutive steps. Also, the zincate treatment may be performed a plurality of times.

FIG. 10H shows a state after the first connection electrode 3 and the second connection electrode 4 have been formed in each semi-finished product 50.

As described above, the first connection electrode 3 and the second connection electrode 4 are formed by electroless plating and the Ni, Pd, and Al, which are the electrode materials can be satisfactorily grown by plating even on the insulating film 47. Also in comparison to a case where the first connection electrode 3 and the second connection electrode 4 are formed by electrolytic plating, the number of steps of the process for forming the first connection electrode 3 and the second connection electrode 4 (for example, a lithography step, a resist mask peeling step, etc., that are necessary in electrolytic plating) can be reduced to improve the productivity of the chip resistor 1. Further in the case of electroless plating, the resist mask that is deemed to be necessary in electrolytic plating is unnecessary and deviation of the positions of formation of the first connection electrode 3 and the second connection electrode 4 due to positional deviation of the resist mask thus does not occur, thereby enabling the formation position precision of the first connection electrode 3 and the second connection electrode 4 to be improved to improve the yield.

Also with this method, the wiring films 22 are exposed from the notched portions 25 and there is nothing that hinders the plating growth from the wiring films 22 to the groove 44. Plating growth can thus be achieved rectilinearly from the wiring films 22 to the groove 44. Consequently, the time taken to form the electrodes can be reduced.

After the first connection electrode 3 and the second connection electrode 4 have thus been formed, a conduction test is performed across the first connection electrode 3 and the second connection electrode 4, and thereafter, the substrate 30 is ground from the rear surface 30B.

Specifically, after the groove 44 has been formed, an adhesive surface 72 of a thin, plate-shaped supporting tape 71, made of PET (polyethylene terephthalate) and having the adhesive surface 72, is adhered onto the first connection electrode 3 and second connection electrode 4 side (that is, the front surface 30A) of each semi-finished product 50 as shown in FIG. 10I. The respective semi-finished products 50 are thereby supported by the supporting tape 71. Here, for example, a laminated tape may be used as the supporting tape 71.

In the state where the respective semi-finished products 50 are supported by the supporting tape 71, the substrate 30 is ground from the rear surface 30B side. When the substrate 30 has been thinned by grinding until the upper surface of the bottom wall 44B (see FIG. 10H) of the groove 44 is reached, there are no longer portions that join mutually adjacent semi-finished products 50 and the substrate 30 is thus separated at the groove 44 as boundaries and the semi-finished products 50 are separated individually to become the finished products of the chip resistors 1. That is, the substrate 30 is cut (divided) at the groove 44 (in other words, the boundary region Z) and the individual chip resistors 1 are thereby cut out. The chip resistors 1 may be cut out instead by etching to the bottom wall 44B of the groove 44 from the rear surface 30B side of the substrate 30.

With each finished chip resistor 1, each portion that formed the defining surface 44C of the side walls 44A of the groove 44 becomes one of the side surfaces 2C to 2F of the substrate 2 and the rear surface 30B becomes the rear surface 2B. That is, the step of forming the groove 44 by etching as described above (see FIG. 10E) is included in the step of forming the side surfaces 2C to 2F. Also, the insulating film 45 and a portion of the insulating film 47 becomes the passivation film 23, the resin film 46 becomes the resin film 24, and a portion of the insulating film 47 becomes the insulating film 26.

The plurality of chip part regions Y formed on the substrate 30 can thus be separated all at once into individual chip resistors 1 (chip parts) (the individual chips of the plurality of chip resistors 1 can be obtained at once) by forming the groove 44 and then grinding the substrate 30 from the rear surface 30B side as described above. The productivity of the chip resistors 1 can thus be improved by reduction of the time for producing the plurality of chip resistors 1.

The rear surface 2B of the substrate 2 of the finished chip resistor 1 may be mirror-finished by polishing or etching to refine the rear surface 2B.

FIG. 13A to FIG. 13D are schematic sectional views of a chip resistor recovery process performed subsequent to the step of FIG. 10I.

Figure 13A:
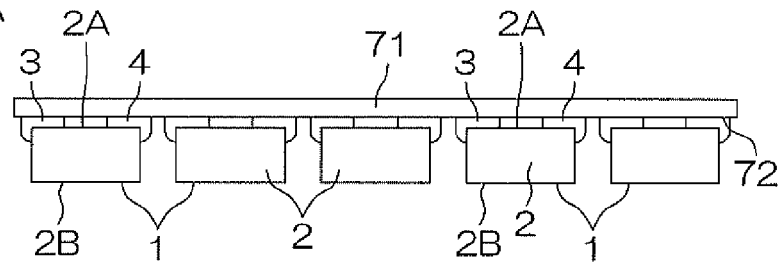
FIG. 13A is a schematic sectional view of a chip resistor recovery process performed subsequent to the step of FIG. 10I.
Figure 13B:
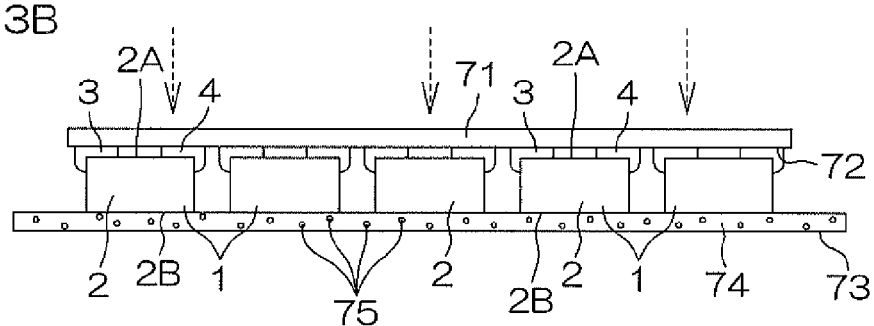
FIG. 13B is a sectional view of a step subsequent to that of FIG. 13A.

FIG. 13A shows a state where the plurality of chip resistors 1, which have been separated into individual chips, continue to be adhered to the supporting tape 71. In this state, a thermally foaming sheet 73 is adhered onto the rear surfaces 2B of the substrates of the respective chip resistors 1 as shown in FIG. 13B. The thermally foaming sheet 73 includes a sheet body 74 of sheet shape and a plurality of foaming particles that are kneaded into the sheet body 74.

Figure 13C:
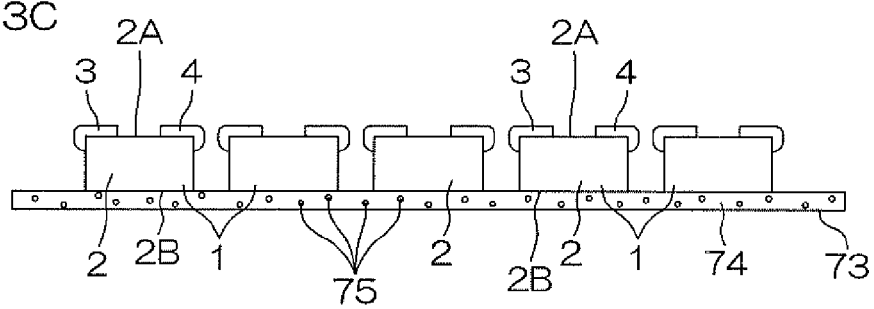
FIG. 13C is a sectional view of a step subsequent to that of FIG. 13B.

The adhesive force of the sheet body 74 is stronger than the adhesive force at the adhesive surface 72 of the supporting tape 71. Thus after the thermally foaming sheet 73 has been adhered onto the rear surfaces 2B of the substrates 2 of the respective chip resistors 1, the supporting tape 71 is peeled off from the respective chip resistors 1 to transfer the chip resistors 1 onto the thermally foaming sheet 73 as shown in FIG. 13C. If ultraviolet rays are irradiated onto the supporting tape 71 in this process (see the dotted arrows in FIG. 13B), the adhesive property of the adhesive surface 72 weakens and the supporting tape 71 can be peeled off easily from the respective chip resistors 1.

Figure 13D:
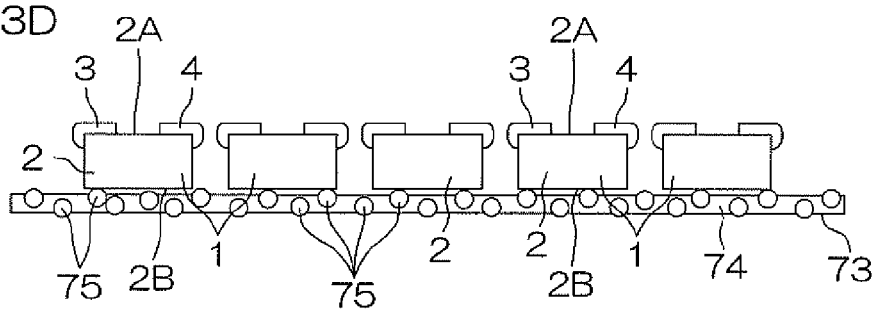
FIG. 13D is a sectional view of a step subsequent to that of FIG. 13C.

Thereafter, the thermally foaming sheet 73 is heated. Thereby in the thermally foaming sheet 73, the respective thermally foaming particles 75 in the sheet body 74 are made to foam and swell out from the front surface of the sheet body 74 as shown in FIG. 13D. Consequently, the area of contact of the thermally foaming sheet 73 and the rear surfaces 2B of the substrates 2 of the respective chip resistors 1 decreases and all of the chip resistors 1 peel off (fall off) from the thermally foaming sheet 73 on their own. The chip resistors 1 that are thus recovered are mounted on a mounting substrate 9 (see FIG. 1B) or housed in housing spaces formed in an embossed carrier tape (not shown). In this case, the processing time can be reduced in comparison to a case where the chip resistors 1 are peeled off one-by-one from the supporting tape 71 or the thermally foaming sheet 73. Obviously, in the state where the plurality of chip resistors 1 are adhered to the supporting tape 71 (see FIG. 13A), a predetermined number of the chip resistors 1 may be peeled off in a predetermined number directly from the supporting tape 71 without using the thermally foaming sheet 73.

Figure 14A:
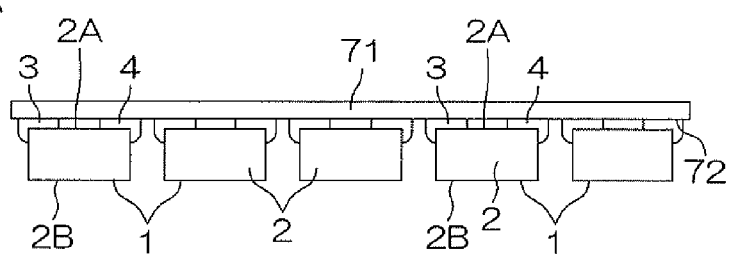
FIG. 14A is a schematic sectional view of a chip resistor recovery process (modification example) performed subsequent to the step of FIG. 10I.
Figure 14B:
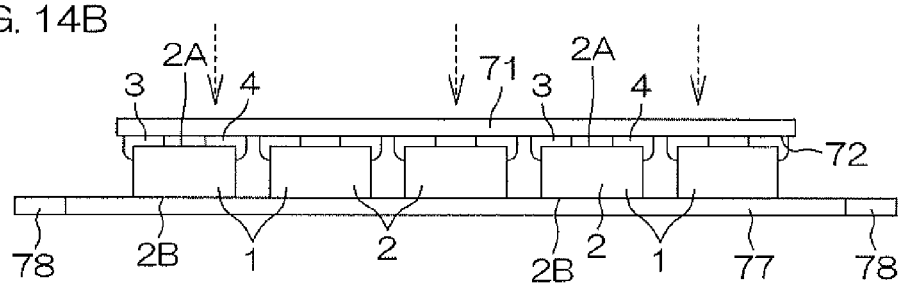
FIG. 14B is a sectional view of a step subsequent to that of FIG. 14A.
Figure 14C:
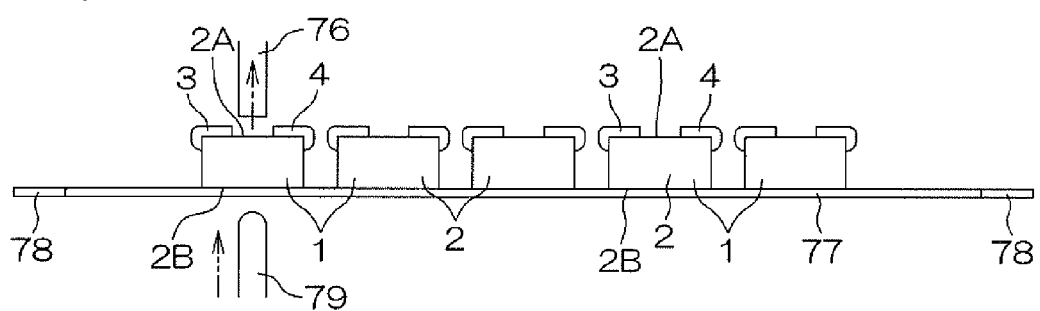
FIG. 14C is a sectional view of a step subsequent to that of FIG. 14B.

FIG. 14A to FIG. 14C are schematic sectional views of a chip resistor recovery process (modification example) performed subsequent to the step of FIG. 10I.

The respective chip resistors 1 may also be recovered by the other method shown in FIG. 14A to FIG. 14C.

As in FIG. 13A, FIG. 14A shows a state where the plurality of chip resistors 1, which have been separated into individual chips, continue to be adhered to the supporting tape 71. In this state, a transfer tape 77 is adhered onto the rear surfaces 2B of the substrates 2 of the respective chip resistors 1 as shown in FIG. 14B. The transfer tape 77 has a stronger adhesive force than the adhesive surface 72 of the supporting tape 71. Thus after the transfer tape 77 has been adhered onto the respective chip resistors 1, the supporting tape 71 is peeled off from the respective chip resistors 1 as shown in FIG. 14C. In this process, ultraviolet rays (see the dotted arrows in FIG. 14B) may be irradiated onto the supporting tape 71 to weaken the adhesive property of the adhesive surface 72 as described above.

Frames 78 of a recovery apparatus (not shown) are adhered to both ends of the transfer tape 77. The frames 78 at both sides are enabled to move in directions of approaching each other or separating from each other. When after the supporting tape 71 has been peeled off from the respective chip resistors 1, the frames 78 at both sides are moved in directions of separating from each other, the transfer tape 77 elongates and becomes thin. The adhesive force of the transfer tape 77 is thereby weakened, making it easier for the respective chip resistors 1 to become peeled off from the transfer tape 77. When in this state, a suction nozzle 76 of a transfer apparatus (not shown) is directed toward the element forming surface 2A side of a chip resistor 1, the chip resistor 1 becomes peeled off from the transfer tape 77 and suctioned onto the suction nozzle 76 by the suction force generated by the transfer apparatus (not shown). When in this process, a projection 79 shown in FIG. 14C pushes the chip resistor 1 up toward the suction nozzle 76 from the opposite side of the suction nozzle 76 and via the transfer tape 77, the chip resistor 1 can be peeled off smoothly from the transfer tape 77. The chip resistor 1 that has thus been recovered is transferred in a state of being suctioned onto the suction nozzle 76 by the transfer apparatus (not shown).

Although a preferred embodiment of the present invention has been described above, the present invention may be implemented in yet other modes as well. For example, although with the preferred embodiment described above, the chip resistor 1 was disclosed as an example of a chip part according to the present invention, the present invention may also be applied to a chip part, such as a chip capacitor, a chip diode, or a chip inductor. A chip capacitor shall now be described below.

Figure 15:
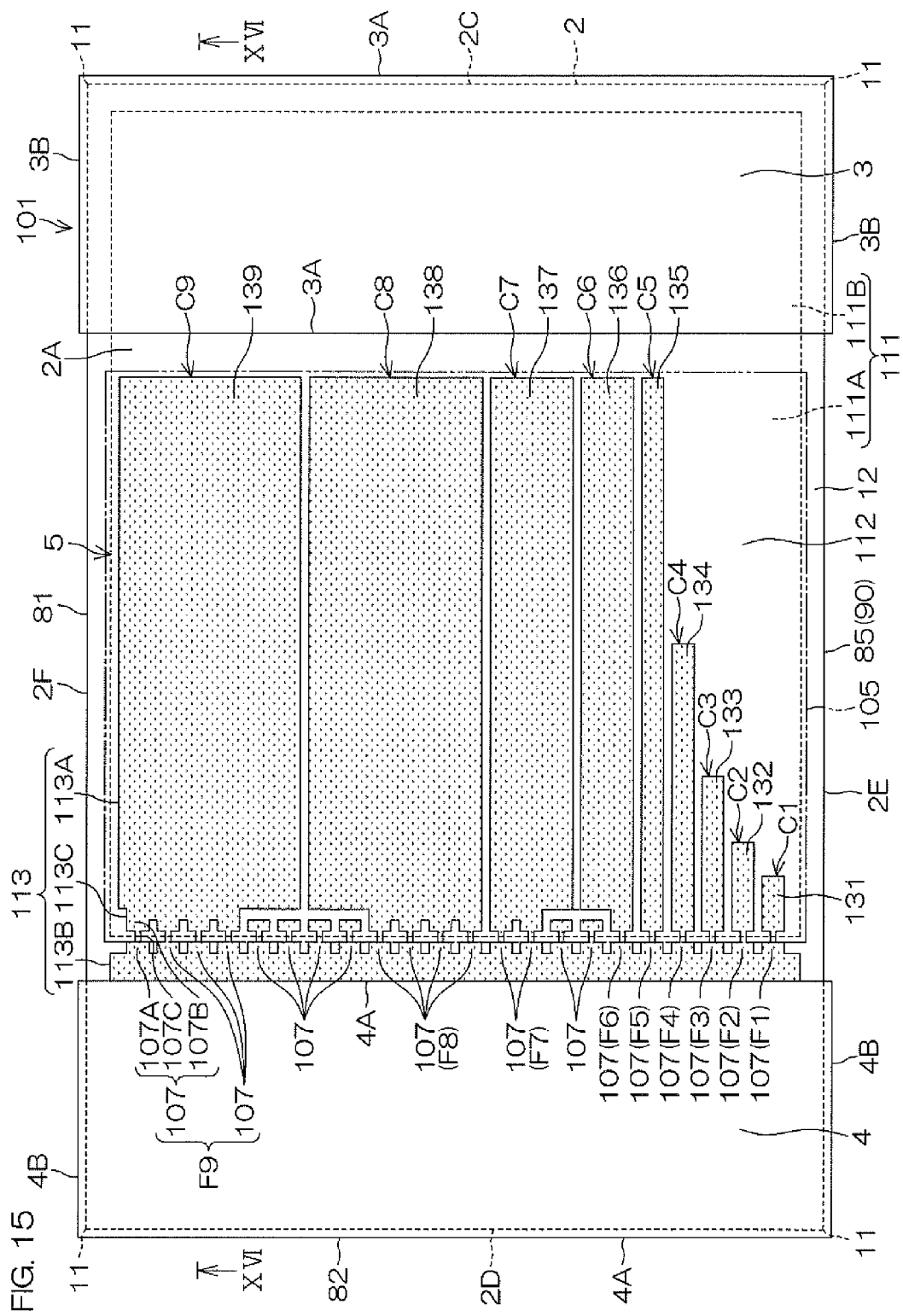
FIG. 15 is a plan view of a chip capacitor according to another preferred embodiment of the present invention.
Figure 16:
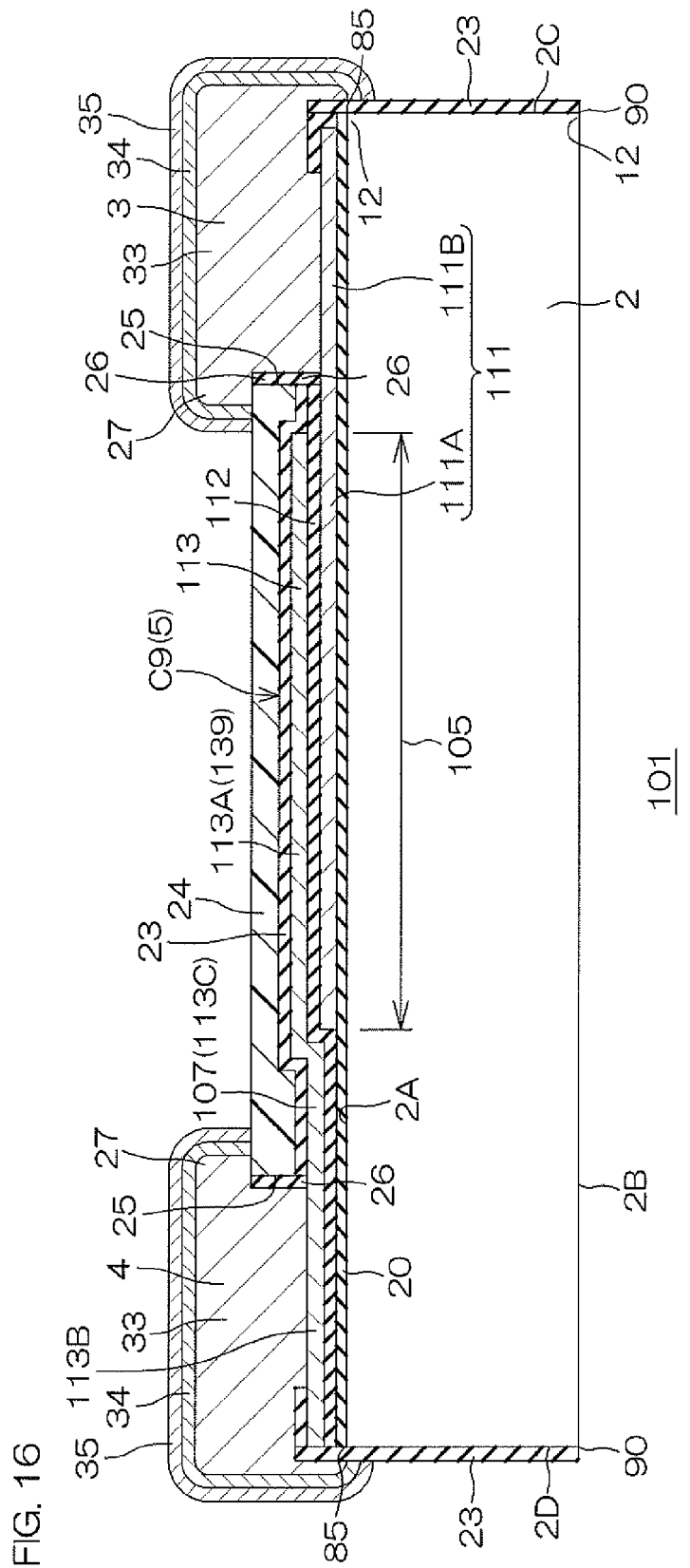
FIG. 16 is a sectional view taken along section line XVI-XVI in FIG. 15.
Figure 17:
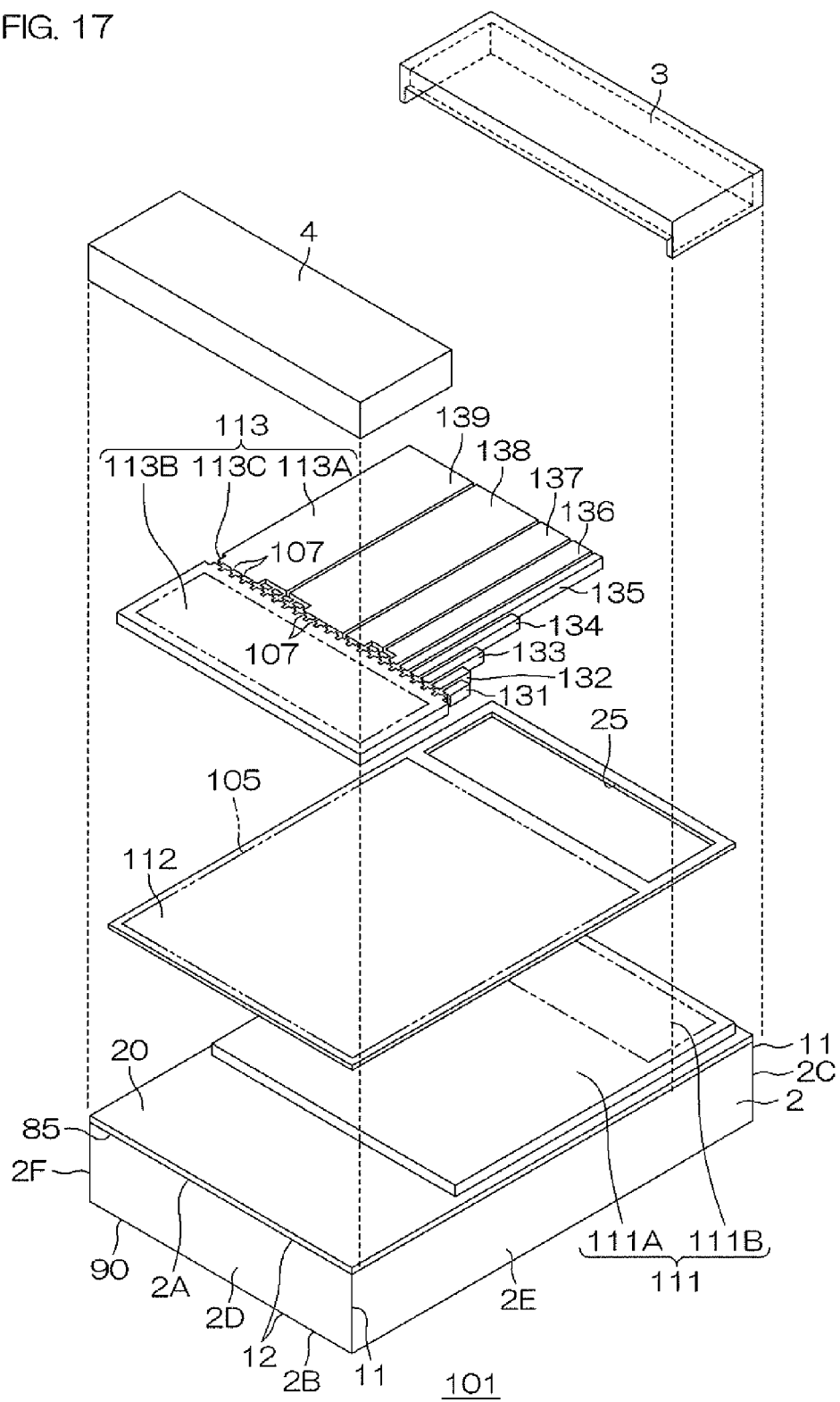
FIG. 17 is an exploded perspective view showing the arrangement of a portion of the chip capacitor in a separated state.

FIG. 15 is a plan view of a chip capacitor according to another preferred embodiment of the present invention. FIG. 16 is a sectional view taken along section line XVI-XVI in FIG. 15. FIG. 17 is an exploded perspective view showing the arrangement of a portion of the chip capacitor in a separated state.

With the chip capacitor 101 to be described below, portions corresponding to portions described above for the chip resistor 1 shall be provided with the same reference symbols and detailed description of such portions shall be omitted. With the chip capacitor 101, the portions provided with the same reference symbols as the portions described for the chip resistor 1 have, unless noted otherwise, the same arrangements as the portions described for the chip resistor 1 and can exhibit the same actions and effects as the portions described for the chip resistor 1 (especially the portions related to the first connection electrode 3 and the second connection electrode 4).

With reference to FIG. 15, the chip capacitor 101 has, like the chip resistor 1, the substrate 2, the first connection electrode 3 disposed on the substrate 2 (at the element forming surface 2A side of the substrate 2), and the second connection electrode 4 disposed similarly on the substrate 2. In the present preferred embodiment, the substrate 2 has, in a plan view, a rectangular shape. The first connection electrode 3 and the second connection electrode 4 are respectively disposed at portions at respective ends in the long direction of the substrate 2. In the present preferred embodiment, each of the first connection electrode 3 and the second connection electrode 4 has a substantially rectangular planar shape extending in the short direction of the substrate 2. As in the chip resistor 1, the first connection electrode 3 and the second connection electrode 4 in the chip capacitor 101 are formed integrally on the element forming surface 2A and the side surfaces 2C to 2F so as to cover the peripheral edge portion 85. Therefore with the circuit assembly 100, in which the chip capacitor 101 is mounted on the mounting substrate 9 (see FIG. 1B and FIG. 1C), the amount of solder 13 adsorbed to the first connection electrode 3 and the second connection electrode 4 can be increased to improve the adhesion strength, as in the case of the chip resistor 1. Also, all of the side surfaces 2C to 2F of the rectangular chip capacitor 101 can be fixed by the solder 13 by the holding of the first connection electrode 3 by the solder 13 at the three side surfaces 2C, 2E, and 2F and the holding of the second connection electrode 4 by the solder 13 at the three side surfaces 2D, 2E, and 2F. The mounting form of the chip capacitor 101 can thus be stabilized.

On the element forming surface 2A of the substrate 2, a plurality of capacitor components C1 to C9 are formed within a capacitor arrangement region 105 between the first connection electrode 3 and the second connection electrode 4. The plurality of capacitor components C1 to C9 are a plurality of element components that constitute the element 5 (a capacitor element in the present case) and are connected between the first connection electrode 3 and the second connection electrode 4. Specifically, the plurality of capacitor components C1 to C9 are electrically connected respectively to the second connection electrode 4 via a plurality of fuse units 107 (corresponding to the fuses F described above) so as to enable disconnection.

As shown in FIG. 16 and FIG. 17, an insulating layer 20 is formed on the element forming surface 2A of the substrate 2, and a lower electrode film 111 is formed on a front surface of the insulating layer 20. The lower electrode film 111 spreads across substantially the entirety of the capacitor arrangement region 105. The lower electrode film 111 is further formed to extend to a region directly below the first connection electrode 3. More specifically, the lower electrode film 111 has, in the capacitor arrangement region 105, a capacitor electrode region 111A functioning as a lower electrode in common to the capacitor components C1 to C9 and has a pad region 111B arranged to lead out to an external electrode and disposed directly below the first connection electrode 3. The capacitor electrode region 111A is positioned in the capacitor arrangement region 105 and the pad region 111B is positioned directly below the first connection electrode 3 and is in contact with the first connection electrode 3.

In the capacitor arrangement region 105, a capacitance film (dielectric film) 112 is formed so as to cover and contact the lower electrode film 111 (capacitor electrode region 111A). The capacitance film 112 is formed across the entirety of the capacitor electrode region 111A (capacitor arrangement region 105). In the present preferred embodiment, the capacitance film 112 further covers the insulating layer 20 outside the capacitor arrangement region 105.

An upper electrode film 113 is formed on the capacitance film 112. In FIG. 15, the upper electrode film 113 is colored for the sake of clarity. The upper electrode film 113 includes a capacitor electrode region 113A positioned in the capacitor arrangement region 105, a pad region 113B positioned directly below the second connection electrode 4 and in contact with the second connection electrode 4, and a fuse region 113C disposed between the capacitor electrode region 113A and the pad region 113B.

In the capacitor electrode region 113A, the upper electrode film 113 is divided (separated) into a plurality of electrode film portions (upper electrode film portions) 131 to 139. In the present preferred embodiment, the respective electrode film portions 131 to 139 are all formed to rectangular shapes and extend in the form of bands from the fuse region 113C toward the first connection electrode 3. The plurality of electrode film portions 131 to 139 face the lower electrode film 111 across the capacitance film 112 over a plurality of types of facing areas (while being in contact with the capacitance film 112). More specifically, the facing areas of the electrode film portions 131 to 139 with respect to the lower electrode film 111 may be set to be 1:2:4:8:16:32:64:128:128. That is, the plurality of electrode film portions 131 to 139 include the plurality of electrode film portions differing in facing area and more specifically include the plurality of electrode film portions 131 to 138 (or 131 to 137 and 139) having facing areas that are set to form a geometric progression with a common ratio of 2. The plurality of capacitor components C1 to C9, respectively arranged by the respective electrode film portions 131 to 139 and the facing lower electrode film 111 across the capacitance film 112, thus include the plurality of capacitor components having mutually different capacitance values. If the ratio of the facing areas of the electrode film portions 131 to 139 is as mentioned above, the ratio of the capacitance values of the capacitor components C1 to C9 is equal to the ratio of the facing areas and is 1:2:4:8:16:32:64:128:128. The plurality of capacitor components C1 to C9 thus include the plurality of capacitor components C1 to C8 (or C1 to C7 and C9) with capacitance values set to form the geometric progression with the common ratio of 2.

In the present preferred embodiment, the electrode film portions 131 to 135 are formed to bands that are equal in width and have lengths with the ratio thereof being set to 1:2:4:8:16. Also, the electrode film portions 135, 136, 137, 138, and 139 are formed to bands that are equal in length and have widths with the ratio thereof being set to 1:2:4:8:8. The electrode film portions 135 to 139 are formed to extend across a range from an end edge at the second connection electrode 4 side to an end edge at the first connection electrode 3 side of the capacitor arrangement region 105, and the electrode film portions 131 to 134 are formed to be shorter than this range.

The pad region 113B is formed to be substantially similar in shape to the second connection electrode 4 and has a substantially rectangular planar shape. As shown in FIG. 16, the upper electrode film 113 in the pad region 113B is in contact with the second connection electrode 4.

The fuse region 113C is disposed along one long side (the long side at the inner side with respect to the peripheral edge of the substrate 2) of the pad region 113B. The fuse region 113C includes the plurality of fuse units 107 that are aligned along the one long side of the pad region 113B.

The fuse units 107 are formed of the same material as and to be integral to the pad region 113B of the upper electrode film 113. The plurality of electrode film portions 131 to 139 are each formed integral to one or a plurality of the fuse units 107, are connected to the pad region 113B via the fuse units 107, and are electrically connected to the second connection electrode 4 via the pad region 113B. As shown in FIG. 15, each of the electrode film portions 131 to 136 of comparatively small area is connected to the pad region 113B via a single fuse unit 107, and each of the electrode film portions 137 to 139 of comparatively large area is connected to the pad region 113B via a plurality of fuse units 107. It is not necessary for all of the fuse units 107 to be used and, in the present preferred embodiment, a portion of the fuse units 107 is unused.

The fuse units 107 include first wide portions 107A arranged to be connected to the pad region 113B, second wide portions 107B arranged to be connected to the electrode film portions 131 to 139, and narrow portions 107C connecting the first and second wide portions 107A and 107B. The narrow portions 107C are arranged to be capable of being cut (fused) by laser light. Unnecessary electrode film portions among the electrode film portions 131 to 139 can thus be electrically disconnected from the first and second connection electrodes 3 and 4 by cutting the fuse units 107.

Although omitted from illustration in FIG. 15 and FIG. 17, a front surface of the chip capacitor 101 that includes a front surface of the upper electrode film 113 is covered by the passivation film 23 as shown in FIG. 16. The passivation film 23 is constituted, for example, of a nitride film and is formed not only to cover the upper surface of the chip capacitor 101 but also to extend to the side surfaces 2C to 2F of the substrate 2 and cover the entireties of the side surfaces 2C to 2F. At the side surfaces 2C to 2F, the passivation film 23 is interposed between the substrate 2 and the first connection electrode 3 or the second connection electrode 4. Further, the resin film 24 is formed on the passivation film 23. The resin film 24 covers the element forming surface 2A.

The passivation film 23 and the resin film 24 are protective films that protect the front surface of the chip capacitor 101. In these films, the notched portions 25 are respectively formed in regions corresponding to the first connection electrode 3 and the second connection electrode 4. The notched portions 25 penetrate through the passivation film 23 and the resin film 24. Further, with the present preferred embodiment, the notched portion 25 corresponding to the first connection electrode 3 also penetrates through the capacitance film 112.

The first connection electrode 3 and the second connection electrode 4 are respectively embedded in the notched portions 25. The first connection electrode 3 is thereby bonded to the pad region 111B of the lower electrode film 111 and the second connection electrode 4 is bonded to the pad region 113B of the upper electrode film 113. Each of the first and second connection electrodes 3 and 4 is formed to project from the front surface of the resin film 24 and has a lead-out portion 27 leading out to an inner side (element 5 side) of the substrate 2 along a front surface of the resin film 24. The chip capacitor 101 can thereby be flip-chip bonded to a mounting substrate.

Figure 18:
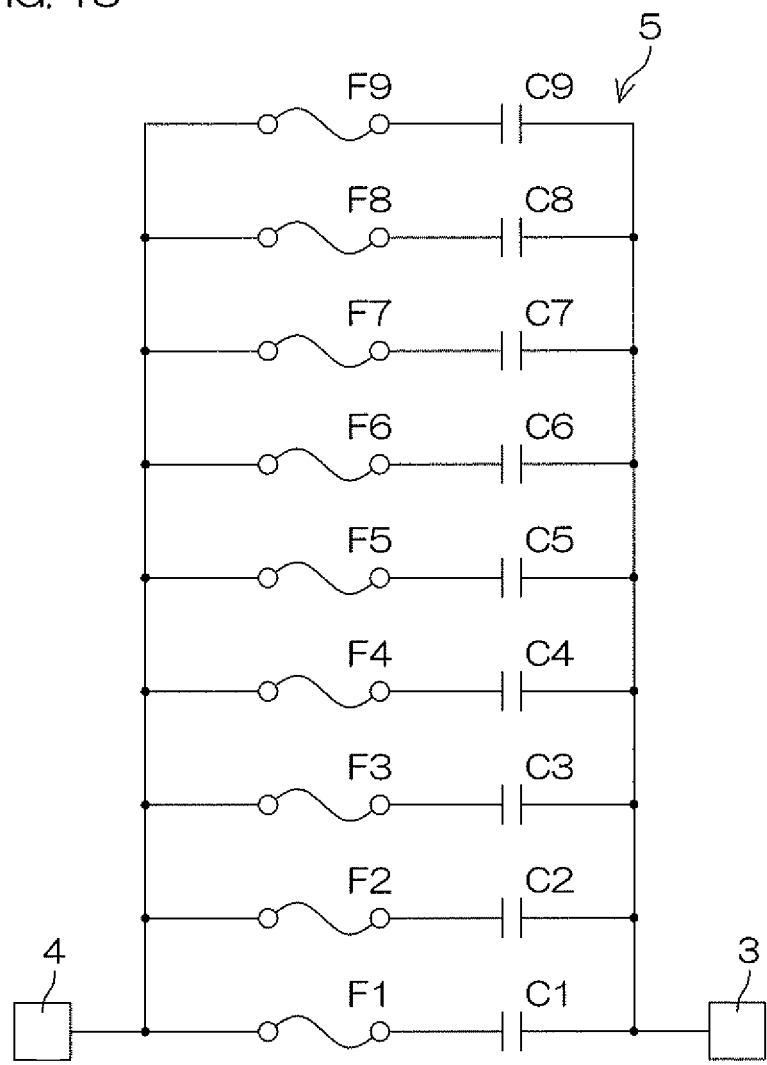
FIG. 18 is a circuit diagram of the electrical arrangement of the interior of the chip capacitor.

FIG. 18 is a circuit diagram of the electrical arrangement of the interior of the chip capacitor. The plurality of capacitor components C1 to C9 are connected in parallel between the first connection electrode 3 and the second connection electrode 4. Fuses F1 to F9, each arranged from one or a plurality of the fuse units 107, are interposed in series between the respective capacitor components C1 to C9 and the second connection electrode 4.

When all of the fuses F1 to F9 are connected, the capacitance value of the chip capacitor 101 is equal to the total of the capacitance values of the capacitor components C1 to C9. When one or two or more fuses selected from among the plurality of fuses F1 to F9 is or are cut, each capacitor component corresponding to the cut fuse is disconnected and the capacitance value of the chip capacitor 101 decreases by just the capacitance value of the disconnected capacitor component or components.

Therefore by measuring the capacitance value across the pad regions 111B and 113B (the total capacitance value of the capacitor components C1 to C9) and thereafter using laser light to fuse one or a plurality of fuses selected appropriately from among the fuses F1 to F9 in accordance with a desired capacitance value, adjustment (laser trimming) to the desired capacitance value can be performed. In particular, if the capacitance values of the capacitor components C1 to C8 are set to form a geometric progression with a common ratio of 2, fine adjustment to the targeted capacitance value at a precision corresponding to the capacitance value of the capacitor component C1, which is the smallest capacitance value (value of the first term in the geometric progression), is made possible.

For example, the capacitance values of the capacitor components C1 to C9 may be set as follows.

C1=0.03125 pF
C2=0.0625 pF
C3=0.125 pF
C4=0.25 pF
C5=0.5 pF
C6=1 pF
C7=2 pF
C8=4 pF
C9=4 pF.

In this case, the capacitance of the chip capacitor 101 can be finely adjusted at a minimum adjustment precision of 0.03125 pF. Also, the fuses to be cut among the fuses F1 to F9 can be selected appropriately to provide the chip capacitor 101 with an arbitrary capacitance value between 10 pF and 18 pF.

As described above, with the present preferred embodiment, the plurality of capacitor components C1 to C9 that can be disconnected by the fuses F1 to F9 are provided between the first connection electrode 3 and the second connection electrode 4. The capacitor components C1 to C9 include a plurality of capacitor components that differ in capacitance value and more specifically include a plurality of capacitor components with capacitance values set to form a geometric progression. Chip capacitors 101, which can accommodate a plurality of types of capacitance values without change of design and can be accurately adjusted to the desired capacitance value by selection and fusion by laser light of one or a plurality of fuses among the fuses F1 to F9, can thus be realized with a common design.

Details of respective portions of the chip capacitor 101 shall now be described.

With reference to FIG. 15, the substrate 2 may have, for example, a rectangular shape of 0.3 mm×0.15 mm, 0.4 mm×0.2 mm, etc. (preferably a size of not more than 0.4 mm×0.2 mm) in a plan view. The capacitor arrangement region 105 is generally a square region with each side having a length corresponding to the length of the short side of the substrate 2. The thickness of the substrate 2 may be approximately 150 µm. With reference to FIG. 16, the substrate 2 may, for example, be a substrate that has been thinned by grinding or polishing from the rear surface side (surface on which the capacitor components C1 to C9 are not formed). As the material of the substrate 2, a semiconductor substrate as represented by a silicon substrate may be used or a glass substrate may be used or a resin film may be used.

The insulating layer 20 may be a silicon oxide film or other oxide film. The film thickness thereof may be approximately 500 Å to 2000 Å.

The lower electrode film 111 is preferably a conductive film, a metal film in particular, and may, for example, be an aluminum film. The lower electrode film 111 that is constituted of an aluminum film may be formed by a sputtering method. Similarly, the upper electrode film 113 is preferably constituted of a conductive film, a metal film in particular, and may, for example, be an aluminum film. The upper electrode film 113 that is constituted of an aluminum film may be formed by the sputtering method. The patterning for dividing the capacitor electrode region 113A of the upper electrode film 113 into the electrode film portions 131 to 139 and shaping the fuse region 113C into the plurality of fuse units 107 may be performed by photolithography and etching processes.

The capacitance film 112 may be constituted, for example, of a silicon nitride film, and the film thickness thereof may be 500 Å to 2000 Å (for example, 1000 Å). The capacitance film 112 may be a silicon nitride film formed by plasma CVD (chemical vapor deposition).

The passivation film 23 may be constituted, for example, of a silicon nitride film and may be formed, for example, by the plasma CVD method. The film thickness thereof may be approximately 8000 Å. As mentioned above, the resin film 24 may be constituted of a polyimide film or other resin film.

Each of the first and second connection electrodes 3 and 4 may, for example, be constituted of a laminated structure film in which a nickel layer in contact with the lower electrode film 111 or the upper electrode film 113, a palladium layer laminated on the nickel layer, and a gold layer laminated on the palladium layer are laminated, and may be formed, for example, by a plating method (or more specifically, an electroless plating method). The nickel layer contributes to improvement of adhesion with the lower electrode film 111 or the upper electrode film 113, and the palladium layer functions as a diffusion preventing layer that suppresses mutual diffusion of the material of the upper electrode film or the lower electrode film and the gold of the uppermost layer of each of the first and second connection electrodes 3 and 4.

Processes for producing the chip capacitor 101 are the same as the processes for producing the chip resistor 1 after the element 5 has been formed.

To form the element 5 (capacitor element) in the chip capacitor 101, first, the insulating layer 20, constituted of an oxide film (for example, a silicon oxide film), is formed on a front surface of the substrate 30 (substrate 2) by a thermal oxidation method and/or CVD method. Thereafter, the lower electrode film 111, constituted of an aluminum film, is formed over the entire front surface of the insulating layer 20, for example, by the sputtering method. The film thickness of the lower electrode film 111 may be approximately 8000 Å. Thereafter, a resist pattern corresponding to the final shape of the lower electrode film 111 is formed on the front surface of the lower electrode film by photolithography. The lower electrode film is etched using the resist pattern as a mask to obtain the lower electrode film 111 of the pattern shown in FIG. 15, etc. The etching of the lower electrode film 111 may be performed, for example, by reactive ion etching.

Thereafter, the capacitance film 112, constituted of a silicon nitride film, etc., is formed on the lower electrode film 111, for example, by the plasma CVD method. In the region in which the lower electrode film 111 is not formed, the capacitance film 112 is formed on the front surface of the insulating layer 20. Thereafter, the upper electrode film 113 is formed on the capacitance film 112. The upper electrode film 113 is constituted, for example, of an aluminum film and may be formed by the sputtering method. The film thickness thereof may be approximately 8000 Å. Thereafter, a resist pattern corresponding to the final shape of the upper electrode film 113 is formed on the front surface of the upper electrode film 113 by photolithography. The upper electrode film 113 is patterned to its final shape (see FIG. 15, etc.) by etching using the resist pattern as a mask. The upper electrode film 113 is thereby shaped to the pattern having the portion divided into the plurality of electrode film portions 131 to 139 in the capacitor electrode region 113A, having the plurality of fuse units 107 in the fuse region 113C, and having the pad region 113B connected to the fuse units 107. The etching for patterning the upper electrode film 113 may be performed by wet etching using an etching liquid, such as phosphoric acid, etc., or may be performed by reactive ion etching.

The element 5 (the capacitor components C1 to C9 and the fuse units 107) in the chip capacitor 101 is formed by the above.

From this state, the laser trimming for fusing the fuse units 107 is performed (see FIG. 10B). That is, each fuse unit 107 constituting a fuse selected in accordance with the measurement result of the total capacitance value is irradiated with laser light and the narrow portion 107C (see FIG. 15) of the fuse unit 107 is fused. The corresponding capacitor component is thereby disconnected from the pad region 113B. When the laser light is irradiated on the fuse unit 107, the energy of the laser light is accumulated at a vicinity of the fuse unit 107 by the action of the insulating film 45 that is a cover film and the fuse unit 107 is thereby fused. The capacitance value of the chip capacitor 101 can thereby be set to the targeted capacitance value reliably.

Thereafter, the same processes as those in the case of the chip resistor 1 are executed in accordance with the processes of FIG. 10C to FIG. 10I.

Although chip parts of the present invention (the chip resistor 1 and the chip capacitor 101) have been described above, the present invention may be implemented in yet other modes as well.

For example, although with the chip resistor 1 among the preferred embodiments described above, an example where the plurality of resistor circuits include the plurality of resistor circuits having resistance values that form a geometric progression with a common ratio r ($0<r$; $r\neq 1$)=2 was described, the common ratio of the geometric progression may be a numeral other than 2. Also, although with the chip capacitor 101, an example where the plurality of capacitor components include the plurality of capacitor components having capacitance values that form a geometric progression with a common ratio r ($0<r$; $r\neq 1$)=2 was described, the common ratio of the geometric progression may be a numeral other than 2.

Also, although with the chip resistor 1 and the chip capacitor 101, the insulating layer 20 is formed on the front surface of the substrate 2, the insulating layer 20 may be omitted if the substrate 2 is an insulating substrate.

Also, although with the chip capacitor 101, the arrangement where just the upper electrode film 113 is divided into the plurality of electrode film portions was described, just the lower electrode film 111 may be divided into a plurality of electrode film portions instead or both the upper electrode film 113 and the lower electrode film 111 may be divided into a plurality of electrode film portions. Further, although in the preferred embodiment, an example where the fuse units are made integral with the upper electrode film or the lower electrode film was described, the fuse units may be formed from a conductor film separate from the upper electrode film and the lower electrode film. Also, although with the chip capacitor 101, the single layer capacitor structure having the upper electrode film 113 and the lower electrode film 111 is formed, another electrode film may be laminated via a capacitance film on the upper electrode film 113 so that a plurality of capacitor structures are laminated.

With the chip capacitor 101, a conductive substrate may be used as the substrate 2, the conductive substrate may be used as a lower electrode, and the capacitance film 112 may be formed in contact with the front surface of the conductive substrate. In this case, one of the external electrodes may be led out from a rear surface of the conductive substrate.

Also, in a case of applying the present invention to a chip inductor, the element 5 formed on the substrate 2 in the chip inductor includes an inductor element, which includes a plurality of inductor components (element components), and is connected between the first connection electrode 3 and the second connection electrode 4. The element 5 is disposed in a multilayer wiring of the multilayer substrate and is formed by the wiring film 22. Also, with the chip inductor, the plurality of fuses F are provided on the substrate 2 and each inductor component is disconnectably connected to the first connection electrode 3 and the second connection electrode 4 via a fuse F.

In this case, with the chip inductor, the pattern of combination of the plurality of inductor components can be set to any pattern by selectively disconnecting one or a plurality of fuses F, and chip inductors of various electrical characteristics can thus be realized with a common design.

Also, in a case of applying the present invention to a chip diode, the element 5 formed on the substrate 2 in the chip diode includes a diode network (diode element), which includes a plurality of diode components (element components). The diode element is formed on the substrate 2. With the present chip diode, the pattern of combination of the plurality of diode components in the diode network can be set to any pattern by selectively disconnecting one or a plurality of fuses F, and chip diodes of various electrical characteristics of the diode network can thus be realized with a common design.

With both the chip inductor and the chip diode, the same actions and effects as those in the case of the chip resistor 1 and the chip capacitor 101 can be exhibited.

Also, in the first connection electrode 3 and the second connection electrode 4 described above, the Pd layer 34 interposed between the Ni layer 33 and the Au layer 35 may be omitted. The adhesion of the Ni layer 33 and the Au layer 35 is good and if the pinhole mentioned above does not form in the Au layer 35, the Pd layer 34 may be omitted.

Figure 19:
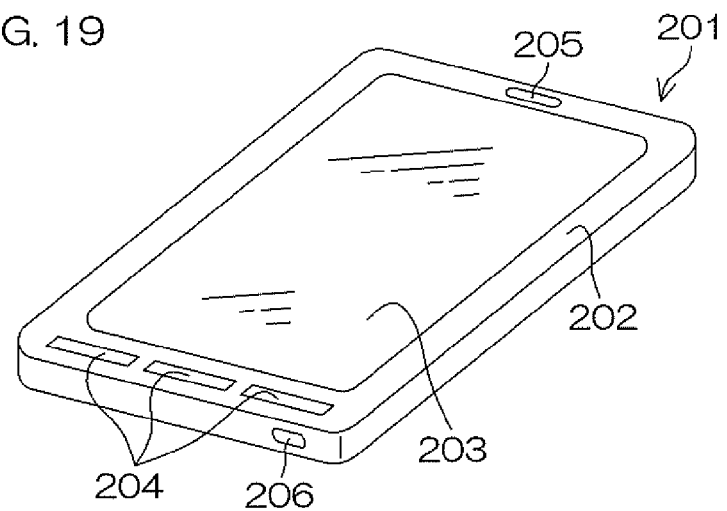
FIG. 19 is a perspective view of an outer appearance of a smartphone that is an example of an electronic device in which chip parts according to the present invention are used.

FIG. 19 is a perspective view of the outer appearance of a smartphone that is an example of an electronic device in which chip parts according to the present invention are used. The smartphone 201 is arranged by housing electronic parts in the interior of a housing 202 with a flat rectangular parallelepiped shape. The housing 202 has a pair of rectangular major surfaces at its front side and rear side, and the pair of major surfaces are joined by four side surfaces. A display surface of a display panel 203, constituted of a liquid crystal panel or an organic EL panel, etc., is exposed at one of the major surfaces of the housing 202. The display surface of the display panel 203 constitutes a touch panel and provides an input interface for a user.

The display panel 203 is formed to a rectangular shape that occupies most of one of the major surfaces of the housing 202. Operation buttons 204 are disposed along one short side of the display panel 203. In the present preferred embodiment, a plurality (three) of the operation buttons 204 are aligned along the short side of the display panel 203. The user can call and execute necessary functions by performing operations of the smartphone 201 by operating the operation buttons 204 and the touch panel.

A speaker 205 is disposed in a vicinity of the other short side of the display panel 203. The speaker 205 provides an earpiece for a telephone function and is also used as an acoustic conversion unit for reproducing music data, etc. On the other hand, close to the operation buttons 204, a microphone 206 is disposed at one of the side surfaces of the housing 202. The microphone 206 provides a mouthpiece for the telephone function and may also be used as a microphone for sound recording.

Figure 20:
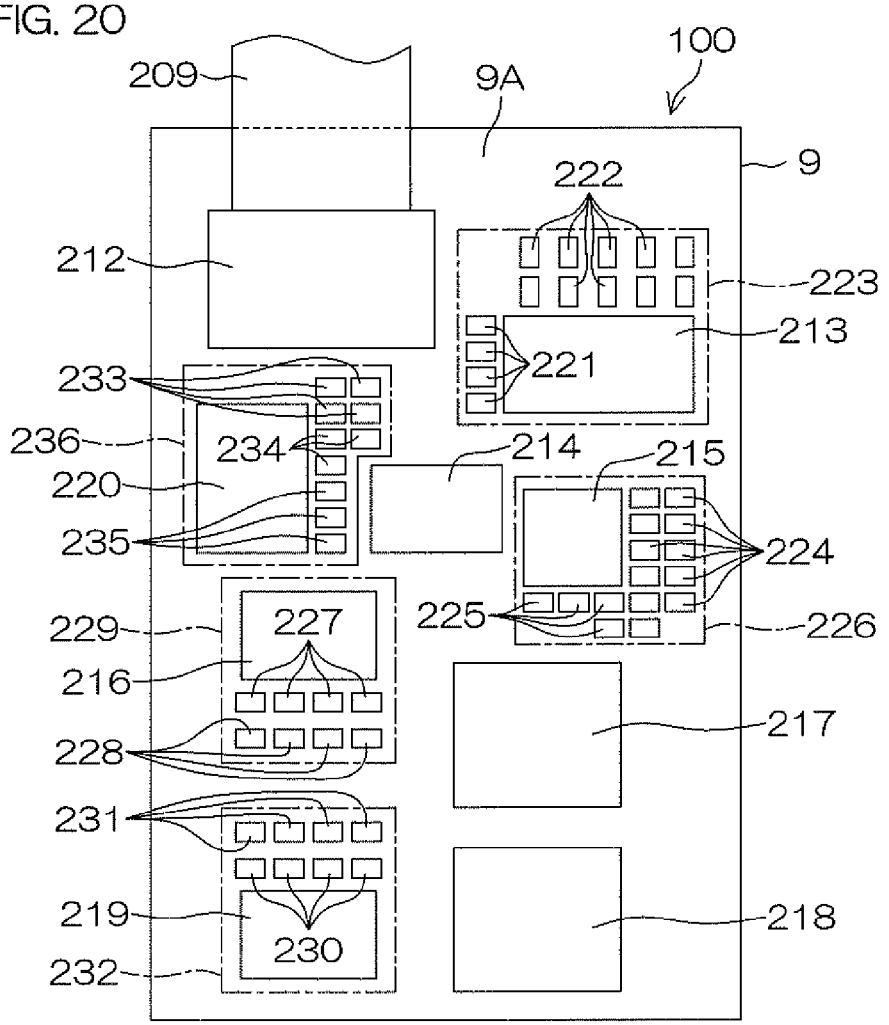
FIG. 20 is an illustrative plan view of the arrangement of a circuit assembly housed in a housing of the smartphone.

FIG. 20 is an illustrative plan view of the arrangement of the circuit assembly 100 housed in the interior of the housing 202. The circuit assembly 100 includes the mounting substrate 9 (which may be the multilayer substrate mentioned above) and circuit parts mounted on the mounting surface 9A of the mounting substrate 9. The plurality of circuit parts include a plurality of integrated circuit elements (ICs) 212 to 220 and a plurality of chip parts. The plurality of ICs include a transmission processing IC 212, a one-segment TV receiving IC 213, a GPS receiving IC 214, an FM tuner IC 215, a power supply IC 216, a flash memory 217, a microcomputer 218, a power supply IC 219, and a baseband IC 220. The plurality of chip parts (corresponding to the chip parts of the present invention) include chip inductors 221, 225, and 235, chip resistors 222, 224, and 233, chip capacitors 227, 230, and 234, and chip diodes 228 and 231.

The transmission processing IC 212 has incorporated therein an electronic circuit arranged to generate display control signals for the display panel 203 and receive input signals from the touch panel on a front surface of the display panel 203. For connection with the display panel 203, the transmission processing IC 212 is connected to a flexible wiring 209.

The one-segment TV receiving IC 213 incorporates an electronic circuit that constitutes a receiver for receiving one-segment broadcast (terrestrial digital television broadcast targeted for reception by portable equipment) radio waves. A plurality of the chip inductors 221 and a plurality of the chip resistors 222 are disposed in a vicinity of the one-segment TV receiving IC 213. The one-segment TV receiving IC 213, the chip inductors 221, and the chip resistors 222 constitute a one-segment broadcast receiving circuit 223. The chip inductors 221 and the chip resistors 222 respectively have accurately adjusted inductances and resistances and provide circuit constants of high precision to the one-segment broadcast receiving circuit 223.

The GPS receiving IC 214 incorporates an electronic circuit that receives radio waves from GPS satellites and outputs positional information of the smartphone 201.

The FM tuner IC 215 constitutes, together with a plurality of the chip resistors 224 and a plurality of the chip inductors 225 mounted on the mounting substrate 9 in a vicinity thereof, an FM broadcast receiving circuit 226. The chip resistors 224 and the chip inductors 225 respectively have accurately adjusted resistance values and inductances and provide circuit constants of high precision to the FM broadcast receiving circuit 226.

A plurality of the chip capacitors 227 and a plurality of the chip diodes 228 are mounted on the mounting surface of the mounting substrate 9 in a vicinity of the power supply IC 216. Together with the chip capacitors 227 and the chip diodes 228, the power supply IC 216 constitutes a power supply circuit 229.

The flash memory 217 is a storage device for recording operating system programs, data generated in the interior of the smartphone 201, and data and programs acquired from the exterior by communication functions, etc.

The microcomputer 218 is a computing processing circuit that incorporates a CPU, a ROM, and a RAM and realizes a plurality of functions of the smartphone 201 by executing various computational processes. More specifically, computational processes for image processing and various application programs are realized by actions of the microcomputer 218.

A plurality of the chip capacitors 230 and a plurality of the chip diodes 231 are mounted on the mounting surface of the mounting substrate 9 in a vicinity of the power supply IC 219. Together with the chip capacitors 230 and the chip diodes 231, the power supply IC 219 constitutes a power supply circuit 232.

A plurality of the chip resistors 233, a plurality of the chip capacitors 234, and a plurality of the chip inductors 235 are mounted on the mounting surface 9A of the mounting substrate 9 in a vicinity of the baseband IC 220. Together with the chip resistors 233, the chip capacitors 234, and the chip inductors 235, the baseband IC 220 constitutes a baseband communication circuit 236. The baseband communication circuit 236 provides communication functions for telephone communication and data communication.

With the above arrangement, electric power that is appropriately adjusted by the power supply circuits 229 and 232 is supplied to the transmission processing IC 212, the GPS receiving IC 214, the one-segment broadcast receiving circuit 223, the FM broadcast receiving circuit 226, the baseband communication circuit 236, the flash memory 217, and the microcomputer 218. The microcomputer 218 performs computational processes in response to input signals input via the transmission processing IC 212 and makes the display control signals be output from the transmission processing IC 212 to the display panel 203 to make the display panel 203 perform various displays.

When receiving of a one-segment broadcast is commanded by operation of the touch panel or the operation buttons 204, the one-segment broadcast is received by actions of the one-segment broadcast receiving circuit 223. Computational processes for outputting the received images to the display panel 203 and making the received audio signals be acoustically converted by the speaker 205 are executed by the microcomputer 218.

Also, when positional information of the smartphone 201 is required, the microcomputer 218 acquires the positional information output by the GPS receiving IC 214 and executes computational processes using the positional information.

Further, when an FM broadcast receiving command is input by operation of the touch panel or the operation buttons 204, the microcomputer 218 starts up the FM broadcast receiving circuit 226 and executes computational processes for outputting the received audio signals from the speaker 205.

The flash memory 217 is used for storing data acquired by communication and storing data prepared by computations by the microcomputer 218 and inputs from the touch panel. The microcomputer 218 writes data into the flash memory 217 or reads data from the flash memory 217 as necessary.

The telephone communication or data communication functions are realized by the baseband communication circuit 236. The microcomputer 218 controls the baseband communication circuit 236 to perform processes for sending and receiving audio signals or data.

The preferred embodiments of the present invention are merely specific examples used to clarify the technical contents of the present invention, and the present invention should not be interpreted as being limited only to these specific examples, and the spirit and scope of the present invention shall be limited only by the appended claims.

The present application corresponds to Japanese Patent Application No. 2012-215062 filed on Sep. 27, 2012 in the Japan Patent Office, and the entire disclosures of this application is incorporated herein by reference.

DESCRIPTION OF THE SYMBOLS 1 chip resistor
2 substrate
2A element forming surface
2C side surface
2D side surface
2E side surface
2F side surface
3 first connection electrode
4 second connection electrode
5 element
9 mounting substrate
9A mounting surface
13 solder
21 resistor body film
22 wiring film
23 passivation film
24 resin film
27 lead-out portion
33 Ni layer
34 Pd layer
35 Au layer
45 insulating film
46 resin film
47 insulating film
56 resistor potion
85 peripheral edge portion
88 land
100 circuit assembly
101 chip capacitor
221 chip inductor
222 chip resistor
224 chip resistor
225 chip inductor
227 chip capacitor
228 chip diode
230 chip capacitor
231 chip diode
233 chip resistor
234 chip capacitor
235 chip inductor
C1~C9 capacitor components
F (F1~F9) fuse
R resistor body

What is claimed is:

1. A chip part, comprising:
a substrate having a front surface and a side surface;
an electrode integrally formed on the front surface and the side surface so as to cover an edge portion of the front surface of the substrate, the electrode being disposed selectively on a front surface side of the substrate;
an insulating film interposed between the electrode and the substrate; and
an element disposed on the front surface side of the substrate.

2. The chip part according to claim 1, wherein
the substrate has a rectangular shape in a plan view thereof, and
the electrode is formed so as to cover the edge portion of the front surface on three sides of the rectangular shape.

3. The chip part according to claim 1, further comprising:
a wiring film that is formed on the front surface of the substrate across an interval from the edge portion and is electrically connected to the electrode.

4. The chip part according to claim 3, wherein with the wiring film, a peripheral edge portion facing the edge portion of the substrate covered by the electrode is selectively exposed and a peripheral edge portion other than the exposed portion is selectively covered by a resin film.

5. The chip part according to claim 4, wherein the electrode is formed so as to project from a front surface of the resin film.

6. The chip part according to claim 5, wherein the electrode includes a lead-out portion that is led out in a lateral direction along the front surface of the resin film to selectively cover the front surface.

7. The chip part according to claim 1, wherein the electrode includes an Ni layer and an Au layer and the Au layer is exposed at a frontmost surface.

8. The chip part according to claim 7, wherein the electrode further includes a Pd layer interposed between the Ni layer and the Au layer.

9. The chip part according to claim 1, wherein
the chip part has another electrode provided across an interval from the electrode, and
the chip part is a chip resistor that includes a resistor body formed on the substrate and connected between the two electrodes.

10. The chip part according to claim 9, further comprising:
 a plurality of resistor bodies including the resistor body; and
 a plurality of fuses provided on the substrate and disconnectably connecting each of the plurality of the resistor bodies to the electrodes.

11. The chip part according to claim 1, wherein
 the chip part has another electrode provided across an interval from the electrode, and
 the element includes a capacitor element formed on the substrate and connected between the two electrodes.

12. The chip part according to claim 11, further comprising:
 a plurality of capacitor components including the capacitor element; and
 a plurality of fuses provided on the substrate and disconnectably connecting each of the plurality of the capacitor components to the electrodes.

13. A circuit assembly comprising:
 the chip part according to claim 1; and
 a mounting substrate having a land, bonded by solder to the electrode, on a mounting surface facing the front surface of the substrate.

14. The circuit assembly according to claim 13, wherein the solder is formed to cover a front surface portion and a side surface portion of the electrode when viewed from a direction of a normal to the mounting surface.

15. An electronic device comprising:
 the circuit assembly according to claim 13; and
 a housing that houses the circuit assembly.

16. The chip part according to claim 1, wherein the insulating film is partly exposed on the side surface of the substrate, a part of the side surface being covered with the electrode.

17. A production method for a chip part comprising:
 a step of forming a groove of a predetermined depth from a front surface of a substrate in a boundary region of a plurality of chip part regions of the substrate to achieve separation into substrates according to each of the plurality of chip part regions;
 a step of forming an insulating film on side surfaces of the groove to form the insulating film on side surfaces of the respective substrates;
 a step of growing by plating an electrode material on the insulating film along the side surfaces of the groove from the front surfaces and via edge portions of the respective substrates to form electrodes integrally on the front surfaces and the side surfaces so as to cover the edge portions of the front surfaces of the respective substrates, the electrodes being disposed selectively on a front surface side of the respective substrates;
 a step of grinding rear surfaces of the substrates until the groove is reached to split the substrates into the plurality of chip parts; and
 a step of disposing an element on the front surface side of the respective substrate in each of the chip parts.

18. The production method for chip part according to claim 17, wherein the step of growing the electrode material includes growing the electrode material by electroless plating.

19. The production method for chip part according to claim 17, further comprising:
 a step of forming a wiring film on the front surface of the substrate of each of the plurality of chip part regions, wherein
 the step of forming the groove includes forming an interval between the edge portion of each substrate and the wiring film, and
 the step of growing includes growing the electrode material from each wiring film by plating.

20. The production method for chip part according to claim 19, further comprising:
 a step of forming a resin film that covers the wiring film before the groove is formed; and
 a step of selectively removing the resin film so as to expose a peripheral edge portion that is to face a region in the wiring film in which the groove is to be formed.

21. The production method for chip part according to claim 17, wherein the groove is formed by etching.

* * * * *

UNITED STATES PATENT AND TRADEMARK OFFICE
CERTIFICATE OF CORRECTION

PATENT NO. : 9,583,238 B2
APPLICATION NO. : 14/431771
DATED : February 28, 2017
INVENTOR(S) : Yasuhiro Kondo et al.

It is certified that error appears in the above-identified patent and that said Letters Patent is hereby corrected as shown below:

In the Claims

Claim 17, Column 33, Line 36, change "A production method for a chip part comprising:" to
-- A production method for a chip part, comprising: --

Signed and Sealed this
Twentieth Day of June, 2017

Joseph Matal
*Performing the Functions and Duties of the*
*Under Secretary of Commerce for Intellectual Property and*
*Director of the United States Patent and Trademark Office*